(12) United States Patent
Shimizu et al.

(10) Patent No.: US 8,927,404 B2
(45) Date of Patent: Jan. 6, 2015

(54) INSULATING FILM AND SEMICONDUCTOR DEVICE INCLUDING THE SAME

(75) Inventors: Tatsuo Shimizu, Tokyo (JP); Masato Koyama, Miura-Gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/445,328

(22) Filed: Apr. 12, 2012

(65) Prior Publication Data

US 2012/0196431 A1 Aug. 2, 2012

Related U.S. Application Data

(63) Continuation of application No. 12/358,466, filed on Jan. 23, 2009, now abandoned.

(30) Foreign Application Priority Data

Jan. 31, 2008 (JP) ................................ 2008-020774

(51) Int. Cl.
| | |
|---|---|
| H01L 21/4763 | (2006.01) |
| H01L 29/51 | (2006.01) |
| H01L 21/318 | (2006.01) |
| H01L 49/02 | (2006.01) |
| H01L 21/28 | (2006.01) |
| H01L 21/316 | (2006.01) |
| H01L 21/3115 | (2006.01) |
| H01L 29/66 | (2006.01) |

(52) U.S. Cl.
CPC ........ *H01L 21/28282* (2013.01); *H01L 29/518* (2013.01); *H01L 29/517* (2013.01); *H01L 21/318* (2013.01); *H01L 28/40* (2013.01); *H01L 29/66553* (2013.01); *H01L 21/316* (2013.01); *H01L 21/31155* (2013.01); *H01L 21/28194* (2013.01); *H01L 29/66545* (2013.01); *H01L 21/28273* (2013.01)
USPC ............. 438/585; 257/E21.638; 257/E21.625

(58) Field of Classification Search
USPC ..................... 438/585; 257/E21.639, E21.625
See application file for complete search history.

(56) References Cited

U.S. PATENT DOCUMENTS

| | | | |
|---|---|---|---|
| 5,939,763 A | 8/1999 | Hao et al. | |
| 6,228,751 B1 * | 5/2001 | Yamazaki et al. | ............ 438/585 |
| 7,307,028 B2 | 12/2007 | Goto et al. | |
| 7,525,144 B2 | 4/2009 | Shimizu et al. | |

(Continued)

FOREIGN PATENT DOCUMENTS

| | | |
|---|---|---|
| JP | 2003-297814 | 10/2003 |
| JP | 2004-336019 | 11/2004 |

(Continued)

OTHER PUBLICATIONS

Office Action issued Sep. 25, 2012 in Japanese Application No. 2008-020774 (With English Abstract).

(Continued)

*Primary Examiner* — Samuel Gebremariam
(74) *Attorney, Agent, or Firm* — Oblon, Spivak, McClelland, Maier & Neustadt, L.L.P.

(57) ABSTRACT

It is made possible to provide an insulating film that can reduce the leakage current. An insulating film includes: an amorphous oxide dielectric film containing a metal, hydrogen, and nitrogen. The nitrogen amount [N] and the hydrogen amount [H] in the oxide dielectric film satisfy the following relationship: $\{[N]-[H]\}/2 \leq 1.0 \times 10^{21}$ cm$^{-3}$.

15 Claims, 20 Drawing Sheets

(56) References Cited

U.S. PATENT DOCUMENTS

| | | |
|---|---|---|
| 2003/0185980 A1 | 10/2003 | Endo |
| 2004/0084736 A1 | 5/2004 | Harada |
| 2004/0155585 A1 | 8/2004 | Harada et al. |
| 2007/0049023 A1 | 3/2007 | Ahn et al. |
| 2007/0241390 A1 | 10/2007 | Tanaka et al. |
| 2008/0067636 A1 | 3/2008 | Shimizu et al. |

FOREIGN PATENT DOCUMENTS

| | | |
|---|---|---|
| JP | 2005-353999 | 12/2005 |
| JP | 2007-273587 | 10/2007 |
| JP | 2007-305966 | 11/2007 |

OTHER PUBLICATIONS

Kaupo Kukli, et al., "Atomic layer deposition of hafnium dioxide thin films from hafnium tetrakis (dimethylamide) and water", Thin Solid Films, vol. 491, 2005, pp. 328-338.

Office Action mailed Mar. 8, 2013 in Japanese Application No. 2008-020774 filed Jan. 31, 2008 (w/English translation).

Interrogatory issued Oct. 11, 2013 in Japanese Patent Application No. 2008-20774 with English language translation.

* cited by examiner

INSULATING FILM AND SEMICONDUCTOR DEVICE INCLUDING THE SAME

CROSS-REFERENCE TO RELATED APPLICATIONS

This application is a continuation of and claims the benefit of priority under 35 U.S.C. §120 from U.S. Ser. No. 12/358,466 filed Jan. 23, 2009, and claims the benefit of priority under 35 U.S.C. §119 from Japanese Patent Application No. 2008-20774 filed Jan. 31, 2008, the entire contents of each of which are incorporated herein by reference.

BACKGROUND OF THE INVENTION

1. Field of the Invention

Described herein is an insulating film of a metal oxide containing hydrogen and a metal, and a semiconductor device including the insulating film.

2. Related Art

To secure the charge to be induced at the channel of a MISFET (metal insulator semiconductor field effect transistor), the gate insulating film is normally made thinner, and the capacity is made larger accordingly. As a result, the $SiO_2$ film as the gate insulating film has become thinner, and at the present, it is now as thin as 1 nm or less. However, there is a large gate leakage current in the $SiO_2$ film, and the power consumption cannot be restricted to an allowable amount due to wasting of standby energy. For example, a 0.8-nm thick $SiO_2$ film has a gate leakage current as large as 1 $kA/cm^2$, and the large power consumption presents a serious problem.

To reduce the power consumption, it is effective to increase the film thickness. Therefore, the use of an insulating film made of a high-k material that can maintain a sufficient charge amount even if the film thickness of the insulating film becomes thicker than that of the $SiO_2$ film is being considered. Various kinds of metal oxides have been known as stable high-k materials. The most promising materials for the insulating films having such characteristics include $HfO_2$, $ZrO_2$, silicates of those materials (HfSiO and ZrSiO), aluminates of those materials (HfAlO, ZrAlO), and $LaAlO_3$.

However, a high-k metal oxide tends to contain oxygen defects, as will be described later. Therefore, large current leakage often occurs due to the oxygen defects, and the reliability becomes poorer.

High-k oxynitrides (HfON, ZrON, HfSiON, and ZrSiON) are also expected to be used for the gate insulating film. However, with a small amount of nitrogen, crystallization occurs in the insulating film, and the insulation characteristics are degraded. Therefore, it is necessary to add a large amount of nitrogen. When a large amount of nitrogen is added, however, as described hereinbelow, more oxygen defects are caused due to the introduction of nitrogen, and large current leakage occurs. As a result, the reliability becomes poorer. If nitrogen exists in the vicinity of the interface between the substrate and the insulating film, fixed charges are generated, and the interfacial structure is disturbed. Therefore, it is preferable to form a structure in which nitrogen is located at a distance from the interface between the substrate and the insulating film (JP-A 2005-353999 (KOKAI)).

As described above, in a case where a high-k oxide or oxynitride is used for the insulating film, oxygen defects are easily formed, and large current leakage occurs due to the oxygen defects. As a result, the reliability becomes poorer.

SUMMARY OF THE INVENTION

The present invention has been made in view of these circumstances, and an object thereof is to provide an insulating film that can reduce the leakage current, and a semiconductor device having the insulating film.

An insulating film according to a first aspect of the present invention includes: an amorphous oxide dielectric film containing a metal, hydrogen, and nitrogen, the nitrogen amount [N] and the hydrogen amount [H] in the oxide dielectric film satisfying the following relationship:

$$\{[N]-[H]\}/2 \le 1.0 \times 10^{21} \, cm^{-3}.$$

An insulating film according to a second aspect of the present invention includes: an amorphous oxide dielectric film containing a quadrivalent metal, a trivalent metal, and hydrogen, the trivalent metal amount [III metal] and the hydrogen amount [H] in the oxide dielectric film satisfying the following relationship: $\{[\text{III metal}]-[H]\}/2 \le 1.0 \times 10^{21} \, cm^{-3}$.

An insulating film according to a third aspect of the present invention includes: an amorphous oxide dielectric film containing a quadrivalent metal, a divalent metal, and hydrogen, the divalent metal amount [II metal] and the hydrogen amount [H] in the oxide dielectric film satisfying the following relationship: $\{2 \times [\text{II metal}]-[H]\}/2 \le 1.0 \times 10^{21} \, cm^{-3}$.

An insulating film according to a fourth aspect of the present invention includes: an amorphous oxide dielectric film containing a trivalent metal, a divalent metal, and hydrogen, the divalent metal amount [II metal] and the hydrogen amount [H] in the oxide dielectric film satisfying the following relationship: $\{[\text{II metal}]-[H]\}/2 \le 1.0 \times 10^{21} \, cm^{-3}$.

A semiconductor device according to a fifth aspect of the present invention includes: a semiconductor substrate; a source region and a drain region provided at a distance from each other in the semiconductor substrate; the insulating film according to the first aspect, provided on a portion of the semiconductor substrate, the portion being a channel region between the source region and the drain region; and a gate electrode provided on the insulating film.

A semiconductor device according to a sixth aspect of the present invention includes: a first electrode; the insulating film according to the first aspect, provided on the first electrode; and a second electrode provided on the insulating film.

A semiconductor device according to a seventh aspect of the present invention includes: a semiconductor substrate; a source region and a drain region provided at a distance from each other in the semiconductor substrate; a first insulating film provided on a portion of the semiconductor substrate, the portion being a channel region between the source region and the drain region; a first electrode provided on the first insulating film; a second insulating film provided on the first electrode; and a second electrode provided on the second insulating film, at least one of the first insulating film and the second insulating film being the insulating film according to the first aspect.

A semiconductor device according to an eighth aspect of the present invention includes: a semiconductor substrate; a source region and a drain region provided at a distance from each other in the semiconductor substrate; a first insulating film provided on a portion of the semiconductor substrate, the portion being a channel region between the source region and the drain region; a charge trapping film provided on the first insulating film; a second insulating film provided on the charge trapping film; and an electrode provided on the second insulating film, at least one of the first insulating film, the charge trapping film, and the second insulating film being the insulating film according to the first aspect.

According to a ninth aspect of the invention, there is provided a semiconductor device including: a first metal; oxygen; hydrogen; and a material being one of nitrogen and a second metal different from the first metal, wherein amount of the hydrogen is expressed as [H], amount of the material is expressed as [X], and a valence number difference between the first metal and the second metal or between oxygen and nitrogen is expressed as k, a following relationship:

$$\{k \times [X] - [H]\}/2 \leq 1.0 \times 10^{21} \text{ cm}^{-3}$$

is satisfied, and if the material is the second metal, the first metal is a quadrivalent metal element, and the second metal is a trivalent metal element, amount of which is expressed as [trivalent element], then [X]=[trivalent element] and k=1, if the material is the second metal, the first metal is a quadrivalent metal element, and the second metal is a divalent metal element, amount of which is expressed as [divalent element], then [X]=[divalent element] and k=2, if the material is the second metal, the first metal is a trivalent metal element, and the second metal is a divalent metal element, amount of which is expressed as [divalent element], then [X]=[divalent element] and k=1, and if the material is nitrogen, amount of which is expressed as [N], then [X]=[N] and k=1.

In the ninth aspect, it is preferable that a following relationship is satisfied $$\{k \times [X] - [H]\}/2 \leq 3.0 \times 10^{20} \text{ cm}^{-3}.$$

In the ninth aspect, it is preferable that following relationships are satisfied $$6.4 \times 10^{19} \text{ cm}^{-3} \leq [X] \leq 1.6 \times 10^{22} \text{ cm}^{-3}/k;$$

and $$6.4 \times 10^{19} \text{ cm}^{-3} \leq [H] \leq 1.6 \times 10^{22} \text{ cm}^{-3}.$$

In the ninth aspect, it is preferable that following relationships are satisfied $$3.0 \times 10^{20} \text{ cm}^{-3} \leq [X] \leq 2.0 \times 10^{21} \text{ cm}^{-3}/k;$$

and $$3.0 \times 10^{20} \text{ cm}^{-3} \leq [H] \leq 2.0 \times 10^{21} \text{ cm}^{-3}.$$

DETAILED DESCRIPTION OF THE INVENTION

Figure 1:
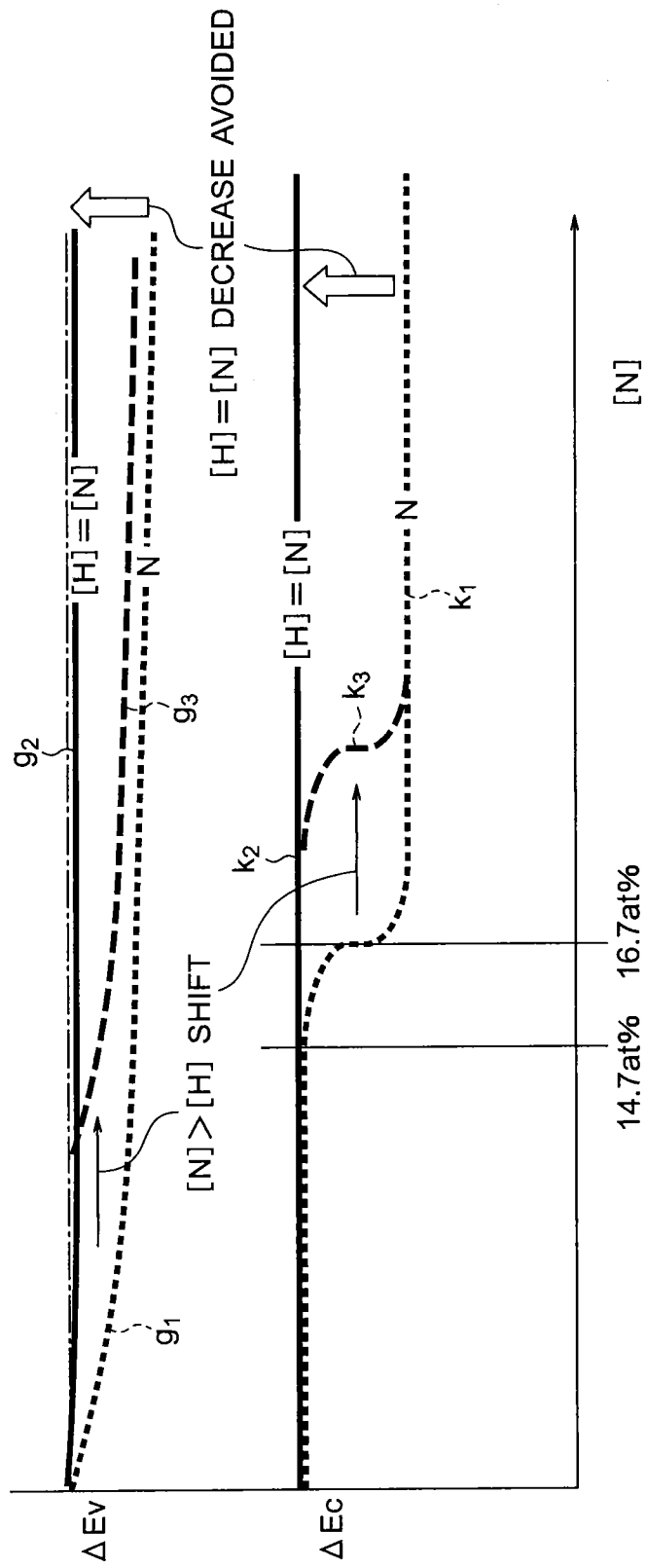
FIG. 1 shows the relationship between the amount of nitrogen [N] to be added to a high-dielectric film and the band offset (ΔE) with respect to a silicon substrate.

Before describing the embodiment, the course of events for achieving the present invention will be described below.

First, the inventors examined metal oxides having high dielectric constants. A high-dielectric metal oxide tends to contain oxygen defects, and the oxygen defects freely move inside the metal oxide. As a result, the following problems are caused, according to the results of the examination conducted by the inventors.

(1) The oxygen defects that are freely moving easily cause crystal precipitation from the amorphous structure, and it is difficult to maintain uniformity in the insulating film characteristics (the problem of phase separation and crystallization).

(2) A defect level appears in the bandgap due to the oxygen defects, and causes a leakage current (the problem of the leakage current through oxygen defects).

(3) Structural defects are formed as the oxygen defects move, and the long-term reliability becomes poorer (the problem of poor reliability).

(4) As electrons are removed from the oxygen defects, the energy is stabilized, and a large threshold voltage (Vth) shift is caused. The Fermi level of the electrode is fixed, and the threshold voltage of the p-type MISFET becomes higher by approximately 0.6 eV and is pinned (the problem of the pinning of Vth in a p-type MISFET).

Those problems are the problems observed in insulating films, and do not concern only MISFETs. The insulating film characteristics present serious problems in an insulating film or a part of the stacked structure used in flash memory cells or a MIM (Metal-Insulator-Metal) capacitor interposed between metal electrodes.

The inventors next examined cases where nitrogen was added to high-dielectric oxides to form HfON, ZrON, HfSiON, ZrSiON, and the likes. The introduction of nitrogen presents the following problems.

(1) The power of nitrogen to fix oxygen defects is small. Therefore, to prevent crystallization or maintain an amorphous state, a large amount of nitrogen needs to be introduced. If only a small amount of nitrogen is introduced, crystallization is caused, and the insulation characteristics are degraded, as is well known.

(2) The bandgap is greatly narrowed by nitrogen. When a large amount of nitrogen is introduced, the band offset $\Delta Ec$ with respect to the Si substrate on the conduction band side decreases by almost 0.5 eV to 1.0 eV. The band offset $\Delta Ev$ with respect to the Si substrate on the valence band side also decreases by almost 1.0 eV. As a result, the leakage current becomes much greater than the leakage current in the original state.

(3) A problem with the long-term reliability is also caused by nitrogen. Through nitrogen introduction, the number of oxygen defects becomes larger, but the oxygen defects are not sufficiently fixed. As a result, a structure change is caused by the movement of the oxygen defects over time. Furthermore, because of the structural change, fixed charges and fixed polarization are caused, and the dielectric characteristics are greatly degraded.

(4) A compound material of nitrogen and oxygen defects Vo (hereinafter referred to as "NVoN") is easily disintegrated. If that happens, the fixed charges are scattered about, and cause a decrease of the mobility of the carriers traveling through the channel.

(5) If there is excess nitrogen introduction, negative charges are generated. This is because nitrogen attracts too many electrons. Depending on the process employed, oxygen defects are easily caused in the vicinities of nitrogen atoms, and the oxygen defects Vo are positively charged. Accordingly, the charges generated by the nitrogen introduction have a possibility to greatly change the threshold voltage Vth. Furthermore, since the fixed charges become scattering substances, the mobility might become much lower. If nitrogen is added through heat diffusion after the formation of a HFSiON film, the oxygen defects Vo are formed, and an insulating film containing a greater amount of positive charges is formed. As a result, the mobility becomes lower, and more scattering substances appear, though charge compensation is performed.

(6) In a "NVoN" structure, the level caused by the oxygen defects is pushed out of the gap. However, if electrons are injected into the level caused by the oxygen defects, the level returns into the gap. This peculiar phenomenon was discovered through the first-principles calculation performed by the inventors. Although a "NVoN" structure appears to cause the level to disappear from the gap, the level remains as the electron trap level in the gap.

The inventors next examined aluminate thin films (HfAlO films and the likes) that have a high degree of expectation for the future. Since Al has a very small ion radius, phase separation is easily caused. When Al is introduced, a large amount of oxygen defects are also introduced. Therefore, phase separation is easily caused through the mobile oxygen defects, as is known. To maintain an amorphous structure, it is necessary to introduce a large amount of Al. In doing so, however, the bottom of the conduction band is affected, and the band offset $\Delta Ec$ with respect to the Si substrate on the conduction band side greatly decreases.

Through the course of the above examinations, the inventors studied the method for completely eliminating the oxygen defects in a metal oxide having a high dielectric constant. As a result, the inventors achieved the following findings.

Typical examples of today's film formation methods for metal oxides having high dielectric constants include CVD (chemical vapor deposition), ALD (atomic layer deposition), MBE (molecular beam epitaxy), and a sputtering technique. By any of those methods, when nitrogen is introduced, a large amount of oxygen defects are formed, depending on the nitrogen amount. Although the power of nitrogen to fix the oxygen defects is small, an appropriate amount of nitrogen should be introduced, so that the amorphous state of the insulating film can be maintained through the heating procedure in the manufacturing process. However, due to the nitrogen introduction, the barrier $\Delta Ev$ against the Si substrate on the valence band side rapidly deteriorates (a decrease of 0.5 eV to 1.5 eV), and the barrier $\Delta Ec$ against the Si substrate on the conduction band side also rapidly deteriorates (a decrease of 0.5 eV to 1.0 eV). As a result, the leakage current becomes much larger than the original leakage current observed in a film of a metal oxide.

In a case where Al is introduced, precipitation is easily caused, because $Al_2O_3$ is stable in terms of energy, and the Al ion radius is much smaller than the ion radius of Hf or Zr. If a large amount Al is introduced, various impurity levels appear in the bandgap, and the degradation of the insulating film characteristics becomes notably large.

In the LSI process, on the other hand, forming gas annealing (FGA) ($H_2$ annealing) is often used. The dangling bonds or the likes in the interface between the Si substrate and the insulating film are terminated with H, and the reliability degradation mechanism that depends on the interface such as NBTI (Negative Bias Temperature Instability) is stopped. In this manner, it is known the reliability is increased. However, it is considered that, when hydrogen is introduced into the insulating film, positive fixed charges are generated (N. Miyata, et al., Applied Physics Letters 86 112906 (2005), for example). As a result, a shift of the threshold voltage Vth occurs, and the mobility becomes much lower due to the fixed charges. Therefore, to increase the reliability, it is necessary to increase the amount of hydrogen in the vicinity of the interface, and minimize the amount of hydrogen to be introduced into the film. For example, FGA ($H_2$ annealing) should be performed for a short period of time at a low temperature, so as to minimize the amount of hydrogen to be introduced into the film. It is known that, during the $H_2$ annealing, $H_2$ does not enter the insulating film, since $H_2$ is in a stable state as it is. In this manner, in the case where hydrogen exists in the vicinity of the interface between the substrate and the insulating film, the NBTI reliability is increased, while the hydrogen in the film hardly affects the NBTI. As a result, charge centers (fixed charges) appear as described above. Therefore, hydrogen is not introduced into insulating films at present.

As described above, before the inventors made the present invention, there was not a known added material that could completely eliminate oxygen defects in a metal oxide, did not narrow the bandgap, and did not generate a level in the gap.

The inventors have made an intensive study on materials to be added to high-dielectric metal oxides. As a result, the inventors discovered that, if nitrogen and hydrogen were used together as the materials to be added, an insulating film with desired characteristics could be obtained.

The following is a description of embodiments, with reference to the accompanying drawings. In the following description, like components having the same functions and structures are denoted by like reference numerals, and explanation of them is repeated only when necessary.

Embodiments

An insulating film in accordance with an embodiment has a main component that is an oxide of a quadrivalent metal (Hf, Zr, or Ti) or a trivalent metal (La, Y, Sc, Al, or a lanthanum series Ln; Ln being Ce, Pr, Nd, Pm, Sm, Eu, Gd, Tb, Dy, Ho, Er, Tm, Yb, and Lu). The insulating film is an oxide insulating film having a material of lower valence than the component metal or nitrogen added thereto. An appropriate amount of H is introduced in accordance with the amount of the added lower-valence material or nitrogen.

More specifically, the insulating film of this embodiment is formed by introducing the same amounts of nitrogen (N) and hydrogen (H) into a high-dielectric thin film of a metal oxide. Examples of metal oxides that may be used for the high-electric thin film include an oxide of a quadrivalent material (Hf, Zr, or Ti) such as $HfO_2$, $HfSiO_4$, $ZrO_2$, $ZrSiO_4$, $TiO_2$, $TiSiO_4$, a silicate of the oxide of a quadrivalent material, an oxide of a trivalent material (Al, Sc, Y, La, or the lanthanum series Ln) such as $LaAlO_3$, $La_2O_3$, $Al_2O_3$, $YAlO_3$, $Y_2O_3$, $La_2SiO_5$, or $LaAlSiO_5$, or more particularly, $(La_2O_3)_p(Y_2O_3)_q(Al_2O_3)_r(SiO_2)_s$ (each of p, q, r, and s being zero or a positive real number), a silicate of the oxide of a trivalent material, an oxide of an mixture of a trivalent material and a quadrivalent material such as $La_2Hf_2O_7$, $Y_2Zr_2O_7$, $LaAlHf_2O_7$, or $La_2Hf_2SiO_9$, or a silicate of the oxide of the mixture of a trivalent material and a quadrivalent material.

FIG. 1 illustrates the effects that are achieved in a case where nitrogen is added to a HfO film. In FIG. 1, the abscissa axis indicates the nitrogen amount [N], and the ordinate axis indicates the offset ΔE in the energy band with respect to a silicon substrate. In FIG. 1, ΔEv represents the offset of the valence band. In a case where only nitrogen is added, the offset ΔEv decreases with an increase of the nitrogen amount, as shown in the graph $g_1$, and becomes smaller by 0.5 eV to 1.5 eV, as mentioned earlier. In a case where the same amounts of nitrogen [N] and hydrogen [H] are added, on the other hand, a decrease in the offset ΔEv can be prevented, as shown in the graph $g_2$. If the amount [N] is larger than the amount [H], the point when the offset ΔEv starts decreasing shifts in the [N] increasing direction, as shown in the graph $g_3$.

In FIG. 1, ΔEc represents the offset of the conduction band. In the case where only nitrogen is added, the offset ΔEc rapidly decreases after the amount [N] becomes larger than 16.7 atomic %, as shown in the graph $k_1$ (the reason for the value "16.7 atomic %" will be described later). As a result, the offset ΔEc becomes smaller by 0.5 eV to 1.0 eV. In the case where the same amounts of nitrogen [N] and hydrogen [H] are added, a decrease in the offset ΔEc can be prevented, as shown in the graph $k_2$. If the amount [N] is larger than the amount [H], the point when the offset ΔEc starts decreasing shifts in the [N] increasing direction, as shown in the graph $k_3$.

Figure 2:
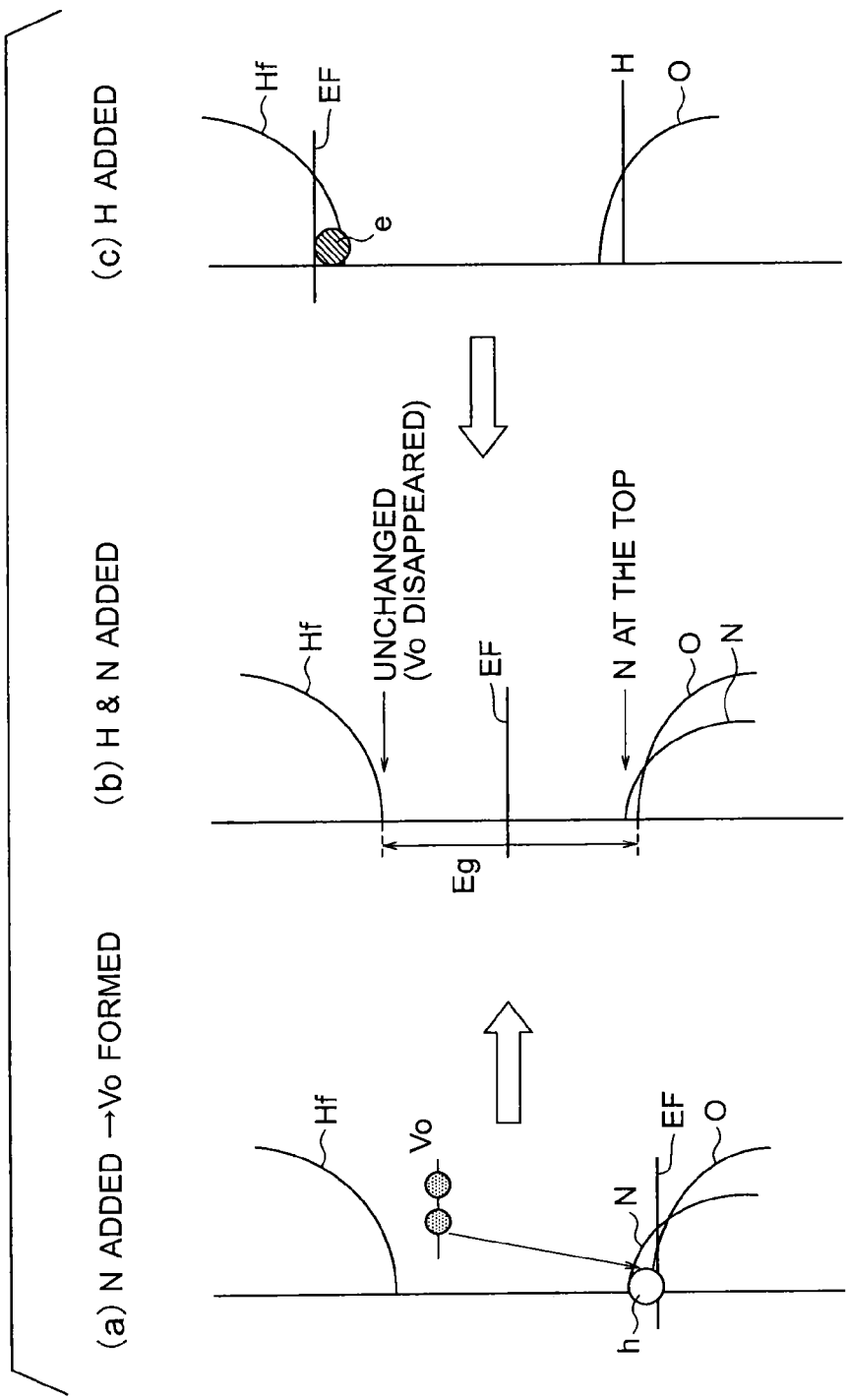
FIGS. 2(a) to 2(c) illustrate the effect achieved when nitrogen N is added to a high-dielectric film, the effect achieved when hydrogen H is added, and the effect achieved when both are added.

Next, the mechanism behind the above characteristics is described. FIGS. 2(a) to 2(c) partially show the lower part of the conduction band to the upper part of the valence band of the density of state (DOS) of HfON. When the oxygen O of $HfO_2$ is substituted by nitrogen N, there is an electron shortage, and a hole h (an electron hole) is formed in the vicinity of the top of the valence band (hereinafter also referred to as the VB), as shown in FIG. 2(a). At this point, oxygen defects Vo are formed. If there are extra electrons e in the vicinities of the oxygen defects Vo, the electrons e occupy the electron hole h in the vicinity of the top of the VB, to reduce the entire energy. This is the mechanism of the occurrence of oxygen defects due to nitrogen introduction, from the viewpoint of a micro-level electronic state. In FIG. 2(a), EF represents the Fermi level.

At this point, there are serious problems in the electronic state of the insulating film, as indicated by the dotted lines in FIG. 1. The first problem is that the top of the VB becomes higher, and the band offset ΔEv with respect to Si becomes smaller. The second problem is that, when a large amount of nitrogen is introduced, the bottom of the conduction band (hereinafter also referred to as the CB) becomes lower due to the interaction between the oxygen defects, and the band offset ΔEc with respect to Si becomes smaller.

Those values with respect to the electronic state, the system energy, and the atomic arrangement were obtained through a first-principles calculation using a ultrasoft pseudopotential. The calculation was based on the density functional approach, and was performed through local density approximation. The potential of the element used in this calculation, such as Hf, Zr, Ti, O, N, H, Ba, Sr, Ca, Mg, La, Y, Sc, Al, and a lanthanum series Ln, has been used in various forms, and proved its high reliability. For example, the lattice constant of $HfO_2$ obtained through the calculation ($a_0$=9.55 Bohr=5.052 Angstrom) is smaller than the experimental value (9.603 Bohr=5.08 Angstrom) only by approximately 0.55%, and is considered to be sufficient. In this embodiment, the calculation is performed on a fluorite $HfO_2$ structure. For example, in a case where 96 atomic unit cells of 2a×2a×2a in size with respect to a lattice constant a is used, the number of k points used in the calculation of the Brillouin zone (BZ) is eight, and the energy cutoff is 30.25 Ryd (1 Ryd=13.6058 eV).

As shown in FIG. 2(c), as the oxygen O is substituted by hydrogen H, there is one extra electron, and the electron is added to the vicinity of the bottom of the CB. The electronic state also exhibits notable characteristics at this point. Even after the oxygen O is substituted by hydrogen H, there are few changes in the state of the bottom of the CB and the state of the top of the VB. Accordingly, decreases of ΔEc and ΔEv can be completely prevented by hydrogen introduction, as indicated by the solid lines in FIG. 1. If the hydrogen amount is not enough, the dotted lines representing the state of nitrogen in FIG. 1 shift toward the right-hand side, as there is extra nitrogen (the graphs $g_1$ and $k_1$ shift to the graphs $g_3$ and $k_3$).

As shown in FIG. 2(a), when nitrogen is introduced, the oxygen defects Vo are formed, and the entire system is stabilized. Likewise, it is possible to stabilize the entire system by filling the electron hole h at the top of the VB caused by nitrogen substitution with the electron e (FIG. 2(c)) at the bottom of the CB caused by hydrogen substitution. FIG. 2(b) shows the final electronic state. In FIG. 2(b), there are almost no decreases of ΔEc and ΔEv. Particularly, the increase of ΔEv due to the nitrogen is stabilized, pulled down by the electronic state of the hydrogen. Thus, a decrease of ΔEv is prevented. In FIG. 2(b), Eg represents the bandgap of the HfON film formed by the addition of H and N.

As shown in FIG. 2(a), when there is no hydrogen, HfON has oxygen defects, and forms "NVoN" structures. As a result, the system is stabilized. At this point, the inner-gap state caused by the oxygen defects is pulled out of the gap. However, when electrons are introduced into the system, the state reappears in the gap, and traps the electrons to stabilize the system. This was found by the first-principles calculation performed by the inventors. This trap is an intermediate state of trap assist tunneling (TAT). Therefore, to maintain the insulating film valid, a new upper limit needs to be set for the state or the number of oxygen defects. The number of oxygen defects needs to be 1 or less for each unit of 2a×2a×2a, and more preferably, is 1 or less for each unit of 3a×3a×3a, with the spread of the trap level being taken into account. This can be determined by checking whether the band appearing in the gap in the band structure has a wider dispersion than the bandgap. There is almost no dispersion in each 2a×2a×2a unit, and the dispersion becomes 5% or less of the bandgap. Accordingly, there are almost no interactions with the neighboring units. The dispersion becomes none in each 3a×3a×3a unit, and becomes 1% or less of the bandgap (becomes flat level). Accordingly, there are no interactions with neighboring units.

In terms of atomic %, the oxygen defects in this unit cell is 1.1 atomic % or less, and more preferably, is 0.31 atomic % or less. This is expressed by the following relationship. Where [N] atomic % represents the nitrogen amount and [H] atomic % represents the hydrogen amount, it is preferable that the following equation is satisfied:

$$\{[N]-[H]\}/2 \leq 1.1 \text{ atomic \%}$$

It is more preferable that the following equation is satisfied:

$$\{[N]-[H]\}/2 \leq 0.31 \text{ atomic \%}$$

Here, $\{[N]-[H]\}/2$ is equal to the amount of oxygen defects. Although the above relationships involve nitrogen, the same upper limit appears when another added material is used.

If the above amounts [N] and [H] are converted into densities ($cm^{-3}$), it is preferable that the following relationship is satisfied:

$$\{[N]-[H]\}/2 \leq 1.0 \times 10^{21} \text{ cm}^{-3}$$

It is more preferable that the following relationship is satisfied:

$$\{[N]-[H]\}/2 \leq 3.0 \times 10^{20} \text{ cm}^{-3}$$

Hereinafter, the same expression unit is used in each one numeric expression.

The above amounts are expressed both in atomic % and density, because the former can be easily understood as the number of added material atoms in each unit, and the latter can be easily applied to any other oxide. With the interaction between the added materials being taken into account, the densities of the added materials in an oxide determine the characteristics of the resultant structure. As the densities of the added materials are higher, the interaction between the added materials is clearly larger. Therefore, amounts expressed in density can be more widely understood than amounts expressed in atomic %.

Figure 3:
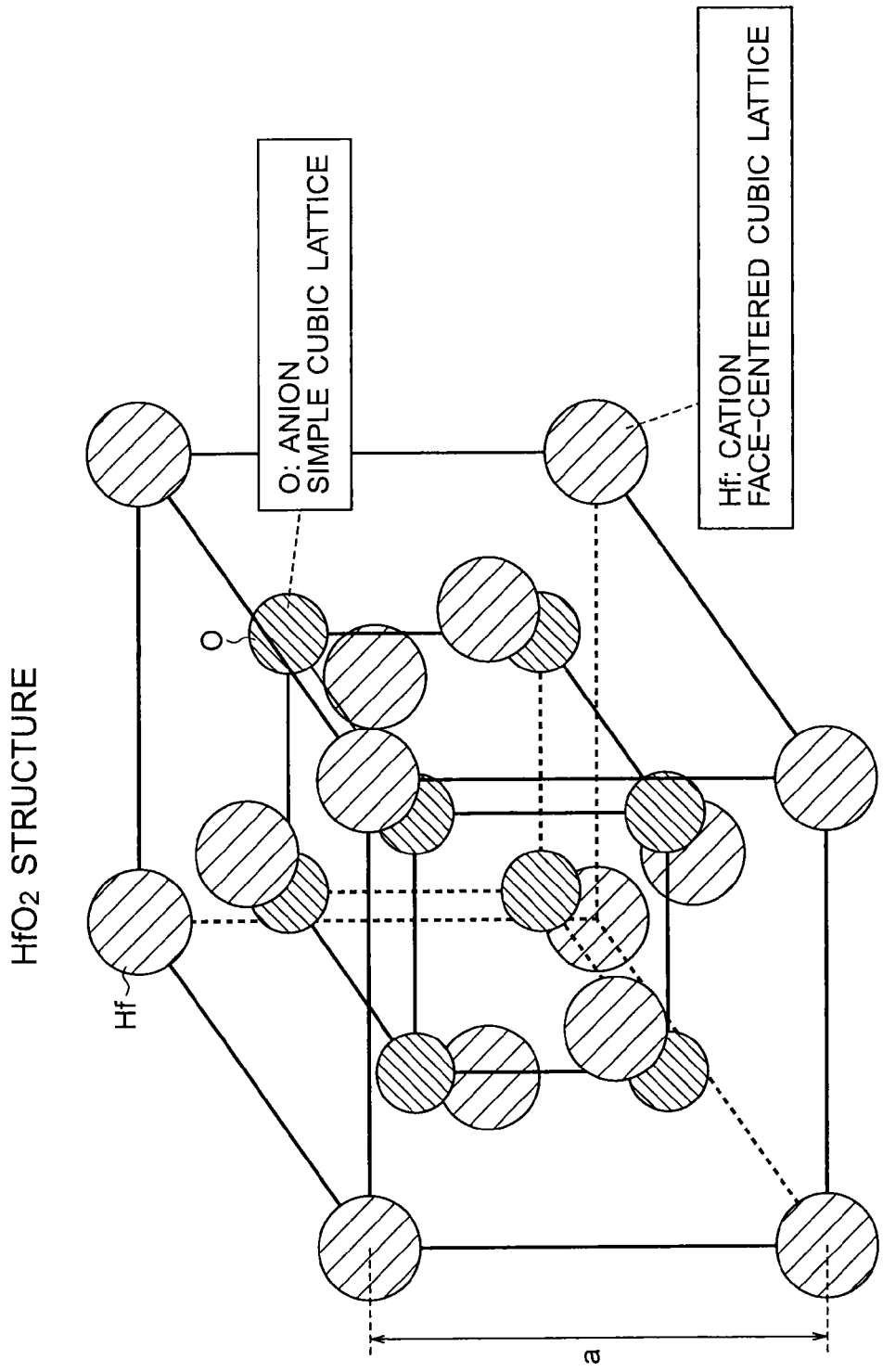
FIG. 3 illustrates the regular lattice structure of $HfO_2$.

The relationships among the unit size of $HfO_2$, the percent expression, and the density expression are now described. The fundamental structure of $HfO_2$ is a so-called calcium fluoride structure that has a face-centered cubic (FCC) lattice formed by Hf serving as the cations, and a simple cubic (SC) lattice formed by O serving as the anions, as shown in FIG. 3. There is four-unit $HfO_2$ in the unit of a×a×a shown in FIG. 3. More specifically, there are four (=8×⅛+6×½) Hf atoms and eight (=8×1) O atoms in the a×a×a unit. If there is one oxygen defect, the atomic percent becomes 1÷12×100 atomic %=8.33 atomic %, since the oxygen defect is one of the twelfth atoms. Also, as the lattice constant a is approximately five angstroms, the atomic percent can be converted into the density: 1÷(5 angstroms×5 angstroms×5 angstroms)=8.0×$10^{21}$ $cm^{-3}$. In this manner, the atomic % expressions and the density expressions with respect to the respective unit cell sizes in a case where one of the atoms is substituted are as follows:

TABLE

| unit | one atom in atomic % | one-atom density |
|---|---|---|
| a × a × a | 8.33 at % | $8.0 \times 10^{21}$ $cm^{-3}$ |
| 2a × 2a × 2a | 1.1 at % | $1.0 \times 10^{21}$ $cm^{-3}$ |
| 3a × 3a × 3a | 0.31 at % | $3.0 \times 10^{20}$ $cm^{-3}$ |
| 4a × 4a × 4a | 0.13 at % | $1.3 \times 10^{20}$ $cm^{-3}$ |
| 4.3a × 4.3a × 4.3a | 0.11 at % | $1.0 \times 10^{20}$ $cm^{-3}$ |
| 5a × 5a × 5a | 0.07 at % | $6.4 \times 10^{19}$ $cm^{-3}$ |
| 6a × 6a × 6a | 0.04 at % | $3.7 \times 10^{19}$ $cm^{-3}$ |

FIGS. 4(a) to 4(d) schematically show the process in which hydrogen is incorporated into HfON. When nitrogen is introduced into $HfO_2$, oxygen defects Vo are formed, with the ratio between the nitrogen and the oxygen defects being 2:1. The entire system is then stabilized (see FIG. 4(a)).

As described above, the fundamental structure of $HfO_2$ is a so-called calcium fluoride structure that has a face-centered cubic (FCC) lattice formed by Hf serving as the cations, and a simple cubic (SC) lattice formed inside by O serving as the anions. The oxygen defects Vo, the nitrogen N, and the hydrogen H substitute the oxygen (anions) positions, and Al, La, Mg, Ba, and the likes substitute the Hf (cations) positions.

Figure 4:
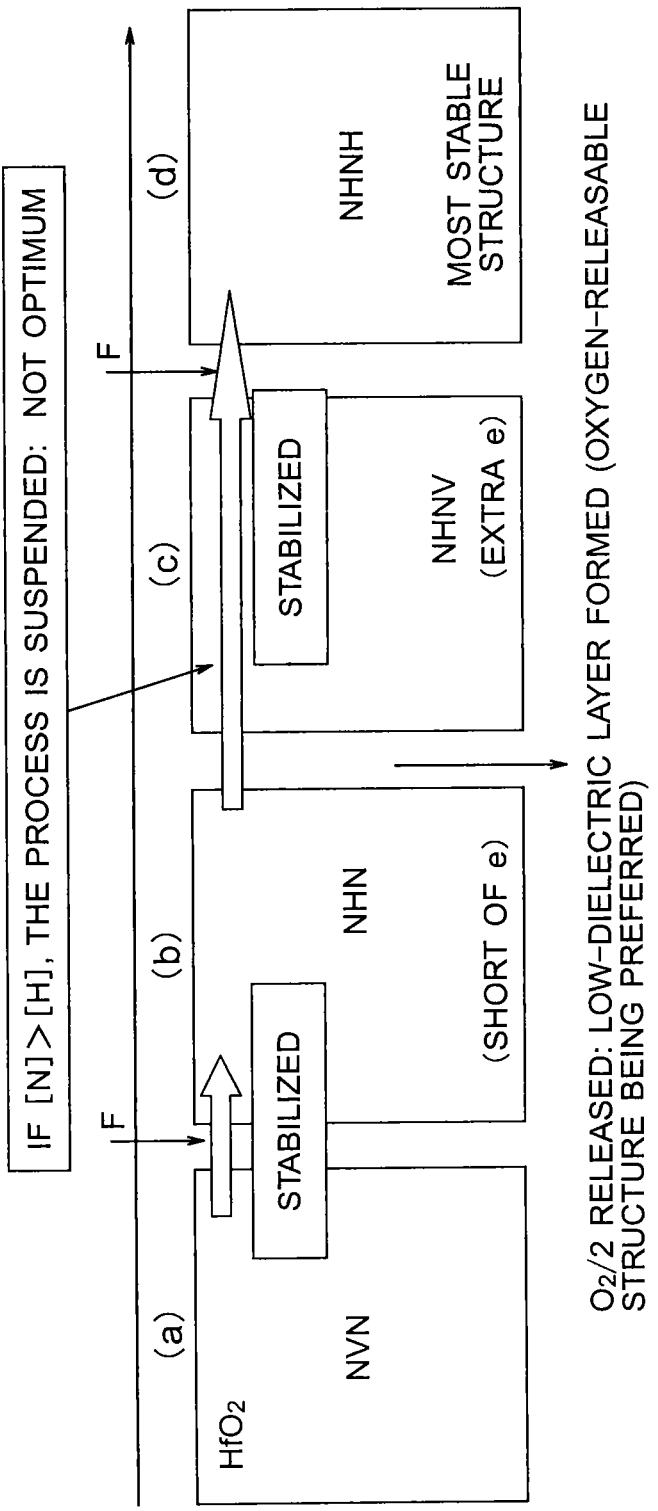
FIGS. 4(a) to 4(d) illustrate the process in which oxygen defects disappear in an insulating film of an embodiment.
Figure 5:
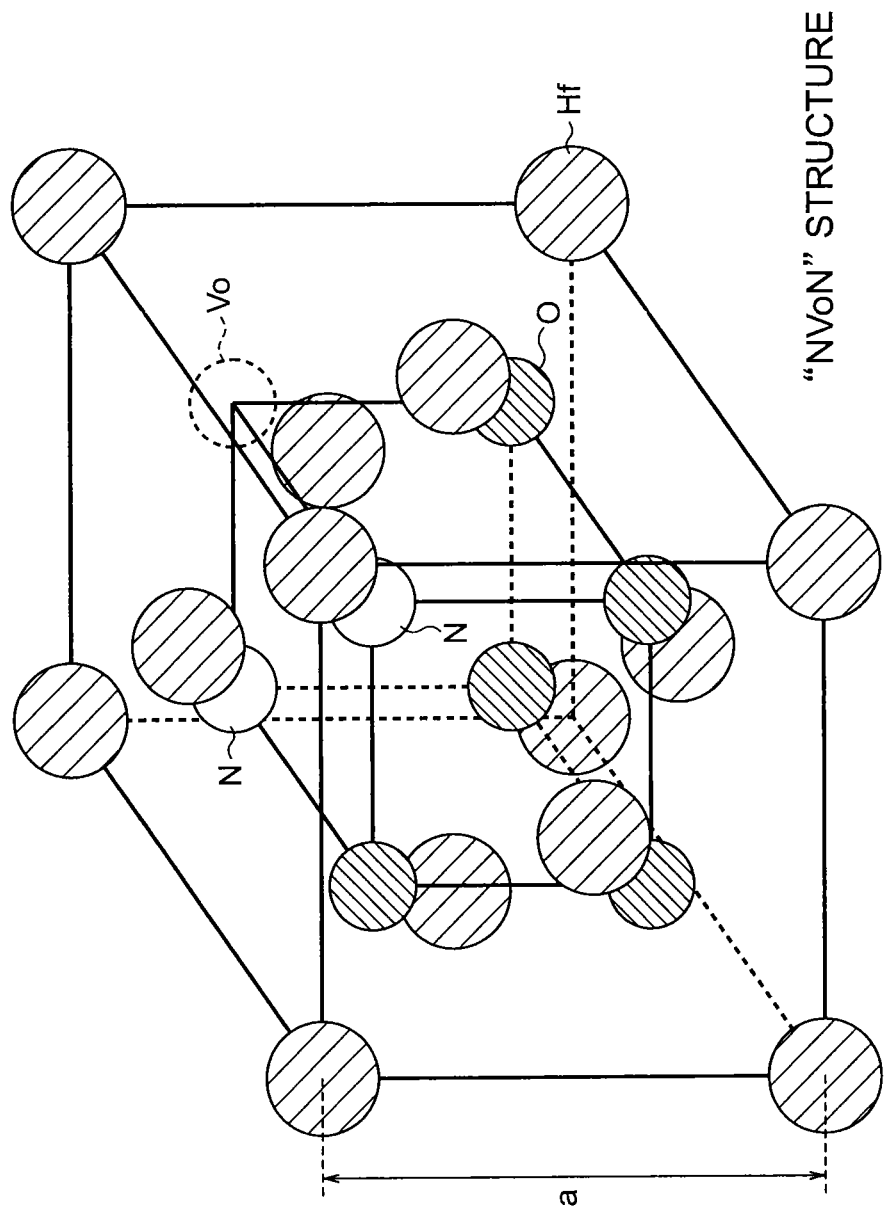
FIG. 5 illustrates a lattice structure to be a NVoN structure that is formed by introducing nitrogen N into $HfO_2$ and has oxygen defects Vo.
Figure 6:
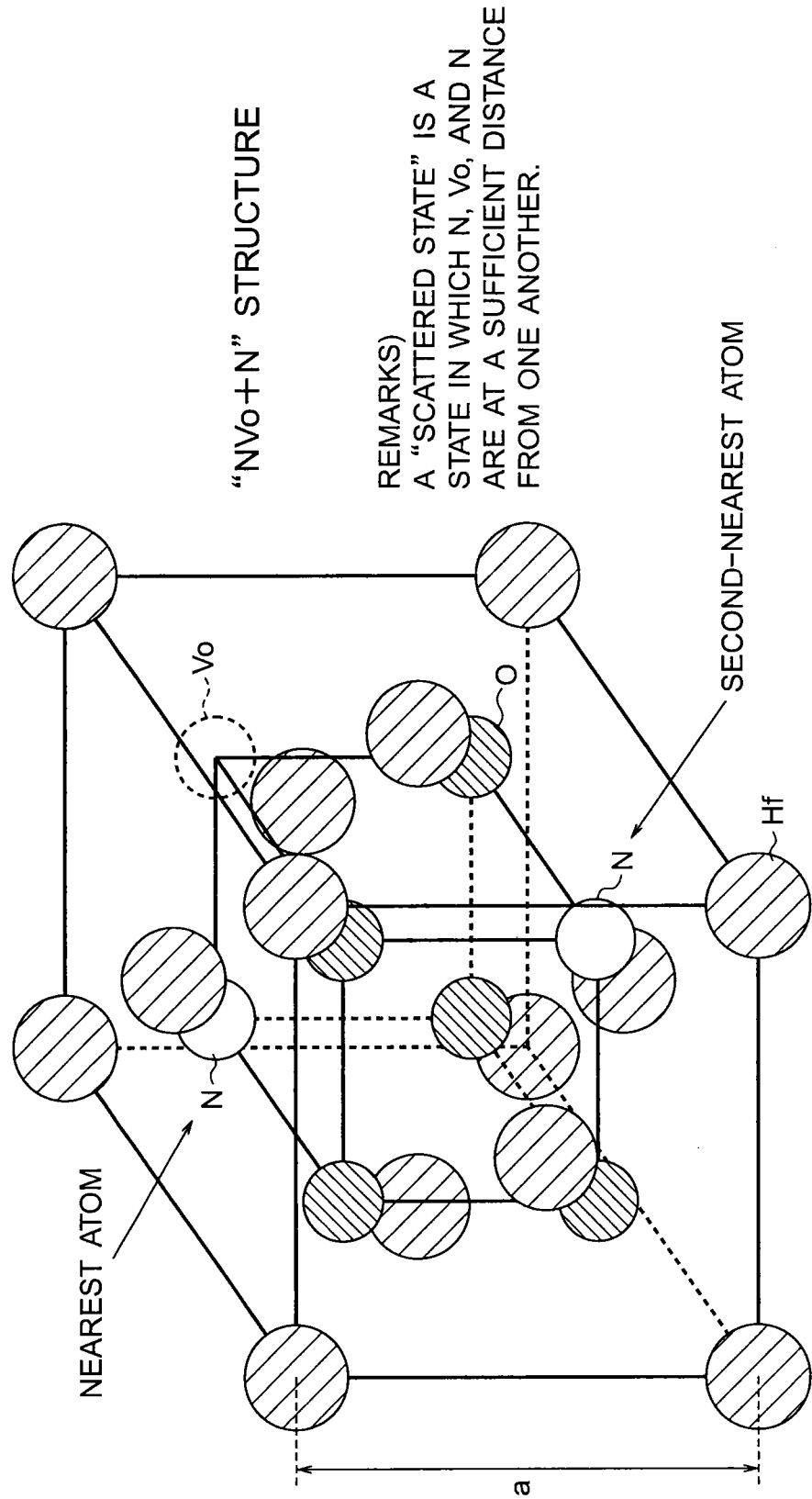
FIG. 6 illustrates a lattice structure to be a (NVo+N) structure that is formed by introducing nitrogen N into $HfO_2$ and has oxygen defects Vo.
Figure 7:
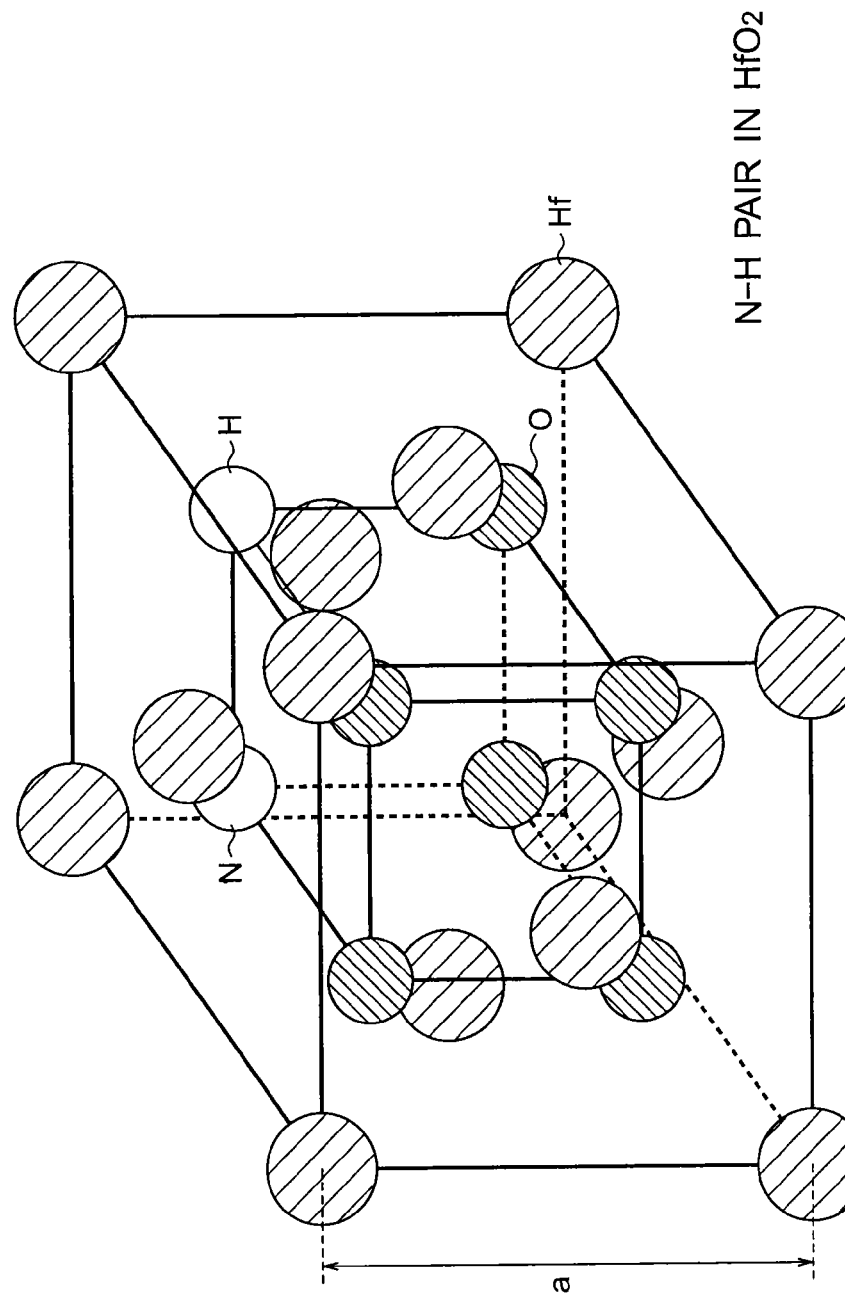
FIG. 7 illustrates a lattice structure that has N—H pairs introduced into $HfO_2$.

When N is incorporated into the fundamental structure of $HfO_2$, a "NVoN" structure (nearest neighbor structure) in which two N atoms become closest to oxygen defects Vo may be formed as shown in FIG. 5, or a "NVo+N" structure (second-neighbor structure) in which one N atom is far away from oxygen defects Vo may be formed as shown in FIG. 6. The energy difference between the two structures is approximately 0.2 eV. It is natural to consider that the oxygen defects Vo are formed adjacent to one of the nitrogen atoms, and supply electrons to the other one of the nitrogen atoms. If hydrogen H is introduced from outside at this point, the hydrogen is absorbed at the locations of the oxygen defects Vo (FIG. 7), and an energy gain is obtained, as is apparent through the first-principles calculation. As a result, there is an electron shortage in the electronic state (FIG. 4(b)). Further, H and N become adjacent to each other, and form a pair, as shown in FIG. 7.

Since it has become apparent that a pair of a nitrogen atom and a hydrogen atom becomes stabilized through an exchange of electrons (FIG. 2(b)), there is an extra nitrogen atom, with the pair of a nitrogen atom and a hydrogen atom being excluded (FIG. 4(b)). The two extra nitrogen atoms cause one oxygen defect Vo through the same mechanism as above. At this point, oxygen ($O_2$/2) is released, and a low-dielectric layer or the like is formed. Therefore, it is preferable to form a structure that can release oxygen to the outside in the hydrogen introduction process. The energy gain during the process of releasing oxygen and absorbing hydrogen is very large.

The above process is repeated to have the same amounts of nitrogen N and hydrogen H at last. Hydrogen H has the highest possibility to become adjacent to nitrogen N and form a pair, and at that point, is in the most stable condition (FIG. 4(d)). If the hydrogen amount is not enough (FIG. 4(c)), the process is suspended, and attention is required as the number of electrons does not match in the suspended state. Even in such a case, the oxygen defects Vo are formed, and, if the heating process to form the structure shown in FIG. 2(a) is carried out, the above "NVoN" structure can be formed. In this manner, the number of electrons can be adjusted. However, since oxygen is released while the oxygen defects Vo remain, the intermediate state of trap assist tunneling (TAT) appears as described above.

(Example Film Formation 1)

Figure 8A:
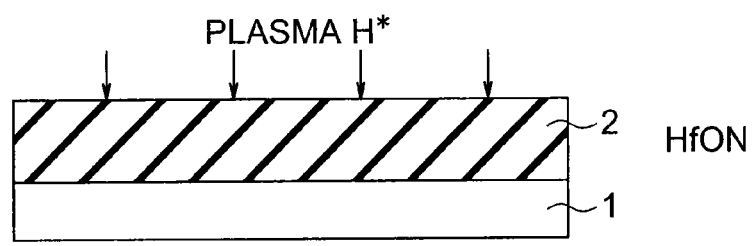
FIGS. 8A and 8B are cross-sectional views illustrating a method for forming an insulating film in accordance with an embodiment.
Figure 8B:
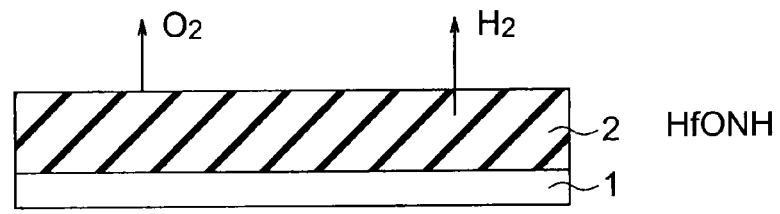

FIGS. 8A and 8B show a first film formation example about a HfONH film into which the same amounts of hydrogen and nitrogen are to be introduced. A $HfO_2$ film is formed by CVD on a silicon substrate 1 subjected to device isolation and channel doping (phosphorus P or boron B are introduced, for example). Plasma nitridation is then performed on the $HfO_2$ film at room temperature, to form a HfON film 2. After that, plasma hydrogenation (60 seconds at room temperature) or hydrogenation using excited hydrogen (also 60 seconds at room temperature) is performed to introduce hydrogen that is excited in an atomic state (FIG. 8A), and form a HfONH film 2. After that, PDA (Post Deposition Annealing) is performed in a vacuum at 900° C. for 60 seconds. Through those procedures, the relationship, $\{[N]-[H]\}/2 \leq 1.1$ atomic % (or $\{[N]-[H]\}/2 \leq 1.0 \times 10^{21}$ $cm^{-3}$ in terms of density), is sufficiently satisfied. $\{[N]-[H]\}/2$ represents the amount of oxygen defects (in the same expression unit as that of the right side). By measuring the film by STS (scanning tunneling spectroscopy), for example, it is possible to determine whether oxygen defects remain in the film or are buried in hydrogen. The temperature and the processing time of the PDA are set so that the hydrogen atoms are scattered in the film.

The plasma hydrogenation (excited hydrogenation) is performed at room temperature and is extended to 100 seconds, so as to maintain the relationship, $\{[N]-[H]\}/2 \leq 0.31$ atomic % (or $\{[N]-[H]\}/2 \leq 3.0 \times 10^{20}$ $cm^{-3}$ in terms of density). In the plasma hydrogenation procedure, it is essential to take a long time, so as to introduce a sufficient amount of hydrogen atoms into the film. However, if the plasma hydrogenation takes too long a time, poor efficiency becomes a problem. Therefore, the plasma hydrogenation procedure is carried out at room temperature for 100 seconds.

Also, to perform the PDA at a low temperature, a long period of time should be taken. For example, by performing the PDA at 600° C. for 180 seconds, extra hydrogen atoms and oxygen defects can be sufficiently reduced. It is possible to determine whether extra hydrogen atoms and oxygen atoms have been reduced to sufficiently small amounts with high precision, through the above STS measurement, the TAT level measurement in a MOSFET, light absorption measurement, or the like. At this point, the extra hydrogen atoms and the remaining oxygen gas $O_2$ used for the hydrogen atom introduction are released from the HfONH film 2 to the outside of the film (FIG. 8B). The plasma hydrogenation or excited hydrogenation is the process to introduce atomic hydrogen, and the PDA is the process to facilitate the dispersion of the atomic hydrogen and the release of extra hydrogen and oxygen.

An electrode (made of a metal material TiN or polysilicon, for example) is then formed. After that, ion implantation (P or B ions) is performed in the case of a polysilicon electrode, at the same time as the gate formation, the sidewall formation, and the ion implantation into the source and drain regions, though not shown in the drawing. Spike annealing at 1050° C. is performed, and $H_2$ sintering is performed, so as to form a MISFET (MOSFET). In the film, H and N form pairs, and are in a stable state. Therefore, when $H_2$ sintering is performed, the hydrogen, nitrogen, or oxygen is not released from the insulating film. Also, since there are no oxygen defects in the insulating film, no more hydrogen is introduced into the film.

In the $H_2$ sintering, hydrogen is not in an atomic state, but exists as stable $H_2$ molecules. Therefore, it is difficult to fill the already stable oxygen defects such as "NVoN", "LaVoLa", "AlVoAl", or "MgVo" with hydrogen. Rather, such oxygen defects are formed to create those stable structures (see JP-A 2007-273587 (KOKAI), for example). If $H_2$ sintering is performed on a film of HfON, HfLaO, HfAlO, HfMgO, or the like prior to stabilization, oxygen defects Vo are formed, and the film is stabilized. At this point, oxygen is released. Therefore, if $H_2$ sintering is performed after the electrode formation as described above, an interfacial low-dielectric layer is formed, and the layer thickness becomes larger.

In the first film formation example of this embodiment, on the other hand, hydrogen excited in an atomic state is introduced into the film during the hydrogen introduction process using plasma hydrogen or excited hydrogen. In this case, the hydrogen is easily absorbed at the oxygen defects, and a stable state is formed. Furthermore, the absorption can be caused at a low temperature.

The above film formation process has the following points to which attention needs be paid.

(1) It is necessary to introduce a large amount of hydrogen into the gate insulating film. Immediately after hydrogenation, a larger amount of hydrogen than the amount of nitrogen is introduced, so that the amount of hydrogen becomes equal to the amount of nitrogen in the process illustrated in FIGS. 4(a) to 4(d). Accordingly, the entire film approaches the most stable state. Extra hydrogen excited in an atomic state is released to the outside. Where there is extra hydrogen excited in an atomic state, the temperature is preferably 950° C. or lower. This is because, if the temperature exceeds 950° C., there is a probability that oxygen is substituted by interstitial hydrogen excited in an atomic state. After the extra hydrogen excited in an atomic state is released to the outside at 950° C. or lower, the temperature can be increased to 950° C. or higher. Accordingly, not a problem is caused if an electrode is formed by performing spike annealing at 1050° C. Since hydrogen can be dispersed at a low temperature, the extra hydrogen excited in an atomic state can be released to the outside at 400° C. or lower. Although high-temperature processing is more efficient timewise, the extra hydrogen might be released to the outside at 400° C., if the structure or process that does not exhibit high heat resistance is employed. In this aspect, hydrogen greatly differs from fluorine. It is difficult to release fluorine through a low-temperature process at 400° C., and extra fluorine becomes fixed charges. It is also difficult to introduce atomic F into the film, since F has high reactivity. As a result, F is introduced through ion implantation, and it is much more difficult to introduce a desired amount of fluorine to an optimum location than hydrogen.

(2) In a case where the hydrogen amount is not enough, there is a shortage of electrons due to nitrogen introduction. To compensate for the shortage with oxygen defects, the temperature needs to be 500° C. or higher, after nitrogen is introduced. More specifically, oxygen defects Vo equivalent to $\{[N]-[H]\}/2$ are formed, and oxygen molecules equivalent to $\{[N]-[H]\}/4$ are released (half the amount of oxygen defects, with one oxygen molecule being formed with two oxygen atoms). Accordingly, excellent insulation characteristics can be achieved.

In connection with the oxygen release, attention needs to be paid, so as not to form a low-dielectric layer, as described above. Attention also needs to be paid to the upper limit of the oxygen defects Vo as already mentioned.

(Example Film Formation 2)

To form a metal oxide film, there are various known methods other than the above CVD method. For example, any kind of technique, such as a vapor deposition technique, a sputtering technique, or an ALD (atomic layer deposition) technique can be used. In a case where plasma nitrogen and hydrogen excited in an atomic state are simultaneously introduced into an insulating film while the insulating film is being deposited, the temperature may be low. During the formation of a $HfO_2$ film, the film is left in a mixed gas of an excited hydrogen gas, an argon gas, and an excited nitrogen gas, and low-temperature heating is performed (at 100° C.). In this manner, hydrogen and nitrogen can be simultaneously introduced into the gate insulating film $HfO_2$. Alternatively, plasma nitrogen and hydrogen excited in an atomic state may be alternately introduced. It is also possible to introduce nitrogen and hydrogen simultaneously, together with a $NH_3$ gas, excited oxygen, plasma hydrogen, or the like. In this case, the nitrogen amount and the hydrogen amount are maintained at the same level since the initial stage of the film formation, which differs from the first film formation example in which hydrogen is introduced after nitrogen introduction. Accordingly, this example has the great advantage that the film formation can be carried out while the most stable structure is being formed. In this case, the process of releasing oxygen from a $HfO_2$ film is not required, and a HfONH film can be formed even in the initial stage. If the process of releasing oxygen is carried out as in a case where hydrogenation is performed later, it is necessary to perform hydrogenation before another film is formed on the insulating film. If the oxygen releasing process is not required, the later procedures can be readily arranged.

(Remarks on Optimum Amounts)

Next, the optimum amounts to be set in a case where hydrogen H and nitrogen N are both added to an ionic oxide insulating film made of a metal and oxygen are described. First, the hydrogen amount [H] should be smaller than or almost equal to the nitrogen amount [N]. The amount of oxygen defects Vo is half the amount of nitrogen that is not paired with hydrogen, and accordingly, is $\{[N]-[H]\}/2$. If the amount of oxygen defects Vo becomes 8.33 atomic % or more, an interaction is caused among the oxygen defects Vo, and a band formed by the oxygen defects Vo appears in the bandgap. As a result, the band offset 4Ec becomes lower. Therefore, 8.33 atomic % ($8.0 \times 10^{21}$ $cm^{-3}$ in density) is the first upper limit.

Meanwhile, $\{[N]-[H]\}$ may be zero or a positive value. This is because extra hydrogen introduction into the film can be prevented by devising a film formation process. Accordingly, $\{[N]-[H]\}$ should be sufficiently larger than at least −1.0 atomic %.

In view of this, the following relationship is satisfied in this embodiment:

$$-1.0 \text{ atomic \%} \leq \{[N]-[H]\}/2 \leq 8.33 \text{ atomic \%}$$

More preferably, the following relationship is satisfied:

$$-0.1 \text{ atomic \%} \leq \{[N]-[H]\}/2 \leq 7.4 \text{ atomic \%}$$

Figure 9:
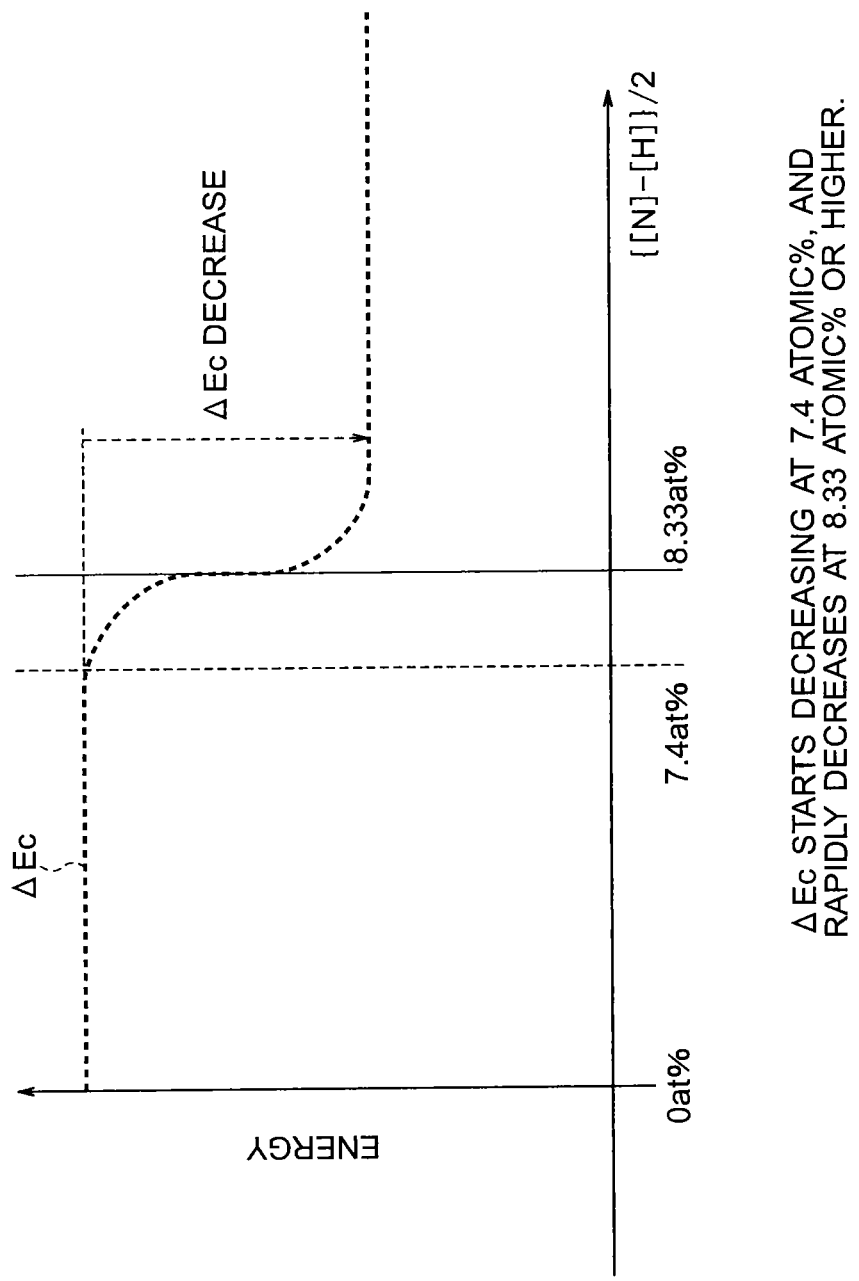
FIG. 9 is a graph showing a rapid change of the band offset observed when {[N]—[H]}/2 is 7.4 to 8.33 atomic % in an embodiment.

$\{[N]-[H]\}/2$ may be zero or a positive value in the neighborhood of zero, and should be 7.4 atomic % or less at a maximum. This is because, if $\{[N]-[H]\}/2$ exceeds 7.4 atomic %, the decrease of the offset ΔEc becomes much larger, as shown in FIG. 9. The reason for the sudden large decrease is that a virtual intermediate state appears in the gap due to the interaction between the oxygen defects.

Oxygen defects characteristically trap electrons. Therefore, if there are a larger amount of oxygen defects than 1.1 atomic % ($1.0 \times 10^{21}$ $cm^{-3}$ in density), the oxygen defects might conduct electricity while trapping electrons. Therefore, it is more preferable to restrict the amount of oxygen defects to 1.1 atomic % or less.

As already mentioned with reference to FIG. 2(a), when electrons are injected into a "NVoN" structure, a state reappears in the gap, and traps electrons for stabilization. The trapping is the intermediate state of trap assist tunneling (TAT). Therefore, the oxygen defects need to be eliminated as much as possible. With the spread of the trap level being taken into account, it is preferable that the number of oxygen defects is 1 or less for each unit of 2a×2a×2a (where the dispersion becomes almost none, and the dispersion width is 1% or less of the bandgap), and it is more preferable that the number of oxygen defects is 1 or less for each unit of 3a×3a× 3a (where the dispersion becomes none, and the dispersion width is 0.2% or less of the bandgap). Therefore, the number of oxygen defects is 1.1 atomic % or less, and more preferably, is 0.31 atomic % or less. In density, the oxygen defects is $1.0 \times 10^{21}$ $cm^{-3}$ or less, and more preferably, is $3.0 \times 10^{20}$ $cm^{-3}$ or less.

Further, from the standpoint of the structure, the following relationship should be satisfied:

$$0.0 \text{ atomic \%} \leq [N]+[H] \leq 50.0 \text{ atomic \%}$$

If the sum of [N] and [H] exceeds 50.0 atomic %, the oxygen amount rapidly decreases, and it becomes difficult to maintain the structure. To maintain a high dielectric constant as an oxide, the oxygen amount should preferably be half or more than the oxygen amount (66.7 atomic %) in the parent structure, or be 33.3 atomic % or more. Accordingly, desired dielectric characteristics are maintained, if the following relationship is satisfied:

$$0.0 \text{ atomic \%} \leq [N]+[H] \leq 33.4 \text{ atomic \%}$$

Further, nitrogen might be first introduced during the film formation process. Through experiments, it has become apparent that an amorphous state cannot be maintained unless the amount of nitrogen introduced into a $HfO_2$ film or the like is 16.7 atomic % or more. In such a case, the "NVoN" structures serve as pins for restricting structural changes. The number of "NVoN" structures is the same as the amount of oxygen defects, which is 8.33 atomic % (=16.7/2 atomic %). The N—H pairs are also considered to serve as pins, and the number of those pairs is equal to the hydrogen amount [H]. Therefore, it is preferable that the sum of [H] and the oxygen defects $\{[N]-[H]\}/2$ that are not paired is 8.33 atomic % or more. In short, the following relationship is satisfied:

$$16.7 \text{ atomic \%} \leq [N]+[H]$$

In the case where nitrogen is first introduced, and H is then introduced, the nitrogen amount needs to be 16.7 atomic % or more, as described above. However, in a case where H and N are simultaneously introduced since the initial stage of the film formation, it is not necessary to introduce a large amount of nitrogen. In this case, the nitrogen amount [N] should be equal to the hydrogen amount [H].

Figure 10:
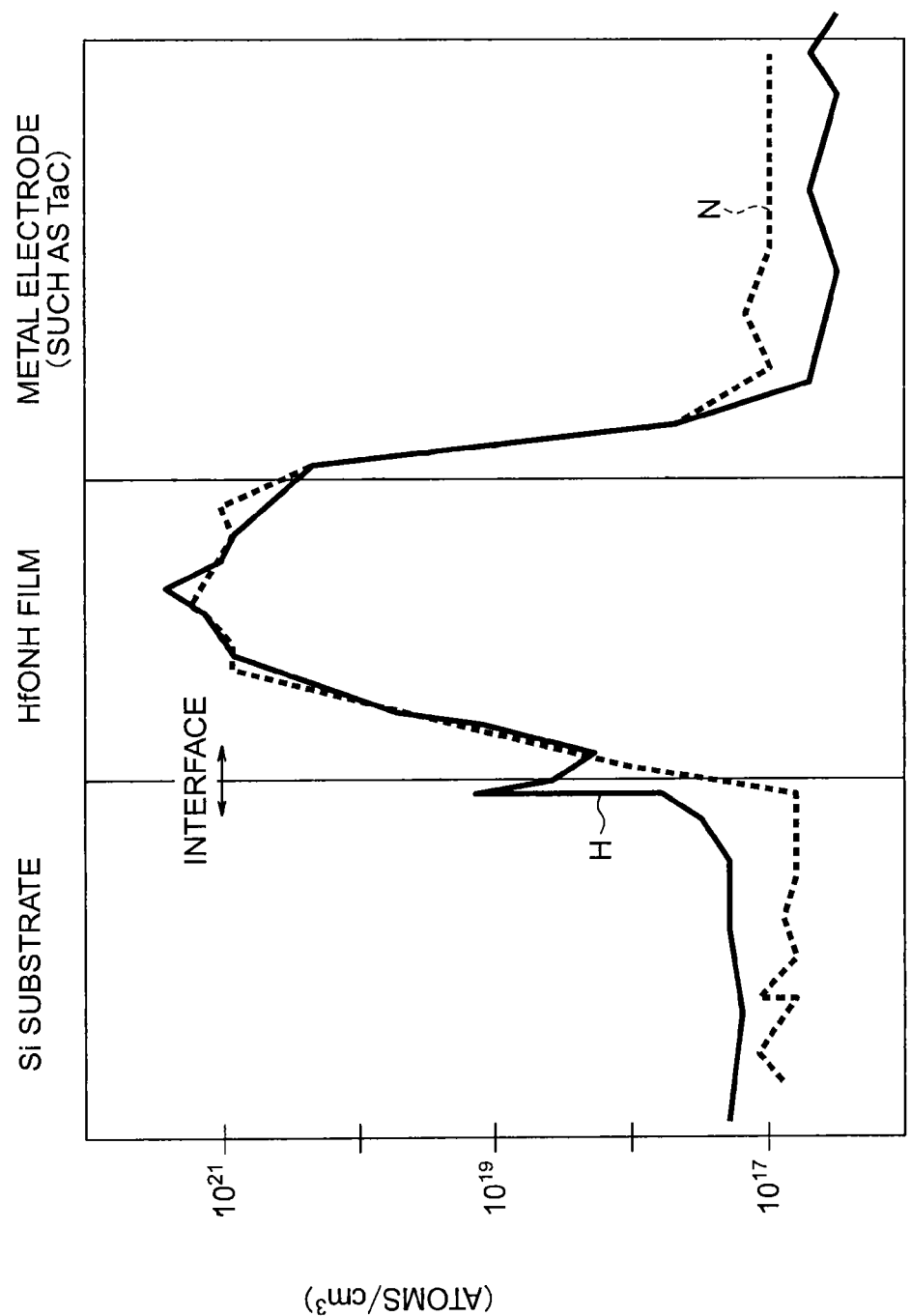
FIG. 10 is a graph showing the results of SIMS analysis made on an insulating film in accordance with an embodiment.

As described above, it is most preferable that [N] and [H] are the same. The errors in measurement by the secondary ion mass spectrometry (SIMS) vary with materials and are very large. FIG. 10 shows data that were analyzed through SIMS. The semiconductor device subjected to the analysis has a structure in which a HfONH film was formed on a Si substrate through the film formation process of this embodiment, and a metal electrode (such as a TaC electrode) was formed on the HfONH film. As can be seen from the analysis results shown in FIG. 10, [N] and [H] in the HfONH film satisfy the following relationship:

$$-1.0 \text{ atomic \%} \leq [N]-[H] \leq 1.0 \text{ atomic \%}$$

where the distribution forms are almost the same. If precise measurement is possible, it is more preferable that the following relationship is satisfied:

$$-0.1 \text{ atomic \%} \leq [N]-[H] \leq 0.1 \text{ atomic \%}$$

Through the film formation process of this embodiment, it is possible in principle to satisfy the relationship, $[N]\geq[H]$.

As already mentioned, STS measurement can determine whether "there are oxygen defects Vo" or "hydrogen is trapped by the oxygen defects Vo". The energy level of the oxygen defects Vo does not exist in the gap when the charges are neutral, but the energy level returns into the gap when electrons are injected. On the other hand, if hydrogen is buried in the oxygen defects, a state (a level) does not appear in the gap even if electrons are injected. By measuring the difference, the amount of oxygen defects can be determined.

Also, changes in the electronic state can be observed in detail through XPS (X-ray Photoelectron Microscopy). In a HfONH film, not only Hf—O bonds but also Hf—N bonds and Hf—H bonds are formed, and distributions of the respective kinds of bonds are formed. Accordingly, remarkable changes occur in the Hf spectrum.

(Upper Limit and Lower Limit of Nitrogen Amount)

Next, the upper limit and the lower limit of the nitrogen amount in an insulating film are described. First, the upper limit is explained.

A nitride film is formed while NVN structures are formed. More specifically, two nitrogen atoms exist for one oxygen defect Vo, and hydrogen fills the oxygen defect. If one NHNH structure (formed with two N—H pairs) or more exist in a unit of a×a×a, the interaction with adjacent units becomes very large, and the band offset $\Delta Ev$ on the valence band side becomes smaller. To avoid this, the nitrogen amount should be 16.7 atomic % or less ($1.6\times10^{22}$ cm$^{-3}$ or less in density). The level of the valence band side tends to be localized. Therefore, even in a case where one NHNH structure exists in a unit of a×a×a, the decreasing rate of the band offset $\Delta Ev$ is restricted to approximately 10% of $\Delta Ev$, as is apparent from calculations performed by the inventors. However, if the nitrogen amount becomes larger than 16.7 atomic %, the band offset $\Delta Ev$ rapidly decreases, and it becomes difficult to maintain the insulation characteristics against holes.

Likewise, in a case where one NHNH structure (formed with two N—H pairs) or less exists in a unit of 2a×2a×2a, the interaction with adjacent units can be prevented, and the band offset $\Delta Ev$ of the valence band side hardly decreases, as is apparent from calculations performed by the inventors. The decrease amount is almost 2%. Therefore, by setting the nitrogen amount at 2.2 atomic % or less ($2.0\times10^{21}$ cm$^{-3}$ or less in density), the band offset $\Delta Ev$ of the valence band side can be prevented from decreasing.

In the above description, the interaction of the state in the vicinity of the top of the valence band due to the nitrogen addition has been described. The added material is not necessarily nitrogen, and the same effects as above can be achieved with some other added material. Particularly, the amount converted into density is valid for any oxide, as the density may be considered as the density of the added material in an oxide. However, attention needs to be paid, because a difference in initial amount of addition is caused, depending on the stable structures formed with the added material and oxygen defects. In the case of nitrogen, one structure is formed with two nitrogen atoms and one oxygen defect. Likewise, in a case where a trivalent material such as Al or La is introduced into an oxide of a quadrivalent material, one stable structure is formed with two Al (or La) atoms and one oxygen defect. In a case where a divalent material such as Ba or Mg is introduced into an oxide of a trivalent material, one stable structure is formed with two Ba (Mg) atoms and one oxygen defect. Accordingly, if the amount of the addition is $1.6\times10^{22}$ cm$^{-3}$ or less, or more preferably, is $2.0\times10^{21}$ cm$^{-3}$ or less, a decrease of the band offset $\Delta Ev$ on the valence band side can be prevented. In a case where a divalent material such as Ba or Mg is introduced into an oxide of a quadrivalent material, on the other hand, one stable structure is formed with one Ba (Mg) atom and one oxygen defect Vo. For example, a Ba-Vo structure is formed. In such a case, the optimum density is half the density in each of the other cases, and, if the amount of the addition is $0.8\times10^{22}$ cm$^{-3}$ or less, or more preferably, is $1.0\times10^{21}$ cm$^{-3}$ or less, a decrease of the band offset $\Delta Ev$ on the valence band side can be prevented.

Next, the lower limit is described. In this embodiment, nitrogen and hydrogen are distributed in a HfO$_2$ film, and the effect to gain entropy can be expected through the distribution. Without the distribution, oxygen defects are formed, and entropy is obtained through distribution of the oxygen defects. At a high temperature of 1050° C. or more, a large amount of oxygen defects are formed, and, if there is one or more nitrogen atoms existing in a 3a×3a×3a unit, the distribution of the oxygen defects can be overcome. Accordingly, control can be performed with the use of nitrogen and hydrogen. In short, 0.31 atomic % ($3.0\times10^{20}$ cm$^{-3}$ in density) or more of nitrogen is sufficient. In a case where a short-time heat treatment is carried out for about 30 seconds at a low temperature of 600° C. or less, the distribution of oxygen defects can be overcome if one nitrogen atom exists in a 5a×5a×5a unit. Accordingly, control can be performed with the use of nitrogen and hydrogen. In short, 0.067 atomic % ($6.4\times10^{19}$ cm$^{-3}$ in density) or more of nitrogen is sufficient. To sum up, if at least 0.067 atomic % ($6.4\times10^{19}$ cm$^{-3}$ in density) or more of nitrogen, or more preferably, 0.31 atomic % ($3.0\times10^{20}$ cm$^{-3}$ in density) or more of nitrogen is added, an insulating film with excellent characteristics without oxygen defects can be formed. Therefore, it is preferable that the nitrogen amount [N] satisfies the following relationship:

$$6.4\times10^{19}\,\text{cm}^{-3}\leq[N]\leq1.6\times10^{22}\,\text{cm}^{-3}$$

Since the hydrogen amount [H] should preferably be approximately the same as the nitrogen amount [N], it is preferable that the hydrogen amount [H] satisfies the following relationship:

$$6.4\times10^{19}\,\text{cm}^{-3}\leq[H]\leq1.6\times10^{22}\,\text{cm}^{-3}$$

It is more preferable that the nitrogen amount [N] satisfies the following relationship:

$$3.0\times10^{20}\,\text{cm}^{-3}\leq[N]\leq2.0\times10^{21}\,\text{cm}^{-3}$$

and it is also more preferable that the hydrogen amount [H] satisfies the following relationship:

$$3.0\times10^{20}\,\text{cm}^{-3}\leq[H]\leq2.0\times10^{21}\,\text{cm}^{-3}$$

In this specification, the state in which the hydrogen amount [H] and the nitrogen amount [N] are approximately the same indicates that the difference $\{[N]-[H]\}$ between the nitrogen amount [N] and the hydrogen amount [H] is less than 10% of $6.4\times10^{19}$ cm$^{-3}$, which is the lower limit of the nitrogen amount [N]. Accordingly, the following relationship is satisfied:

$$0\leq\{[N]-[H]\}<0.1\times6.4\times10^{19}\,\text{cm}^{-3}$$

In view of this, the lower limit of the hydrogen amount [H] is defined as follows:

$$[H]>6.4\times10^{19}\,\text{cm}^{-3}-0.1\times6.4\times10^{19}\,\text{cm}^{-3}=5.76\times10^{19}\,\text{cm}^{-3}$$

In the above description, the entropy obtained with an added material has been described. However, the added material is not necessarily nitrogen, and the same effects as above can be achieved with some other added material. Particularly, the added material should only have the density to generate the same size of distribution, as the density may be considered as the density of oxygen defects. The amount converted into density is valid for any oxide. Accordingly, if at least $6.4 \times 10^{19}$ cm$^{-3}$ or more, or more preferably, $3.0 \times 10^{20}$ cm$^{-3}$ or more of an added material is added, oxygen defects are not formed, and an insulating film with excellent characteristics can be formed.

In the above description, the cases at different temperatures have been described. Those cases involve an important difference in terms of semiconductor device production. In a case where the source and drain are activated after a gate insulating film is formed, the gate insulating film is subjected to activation annealing at approximately 1050° C. In this case, it is necessary to add a certain amount of additional material to the gate insulating film. In a case where a gate insulating film is formed after the activation of the source and drain, on the other hand, the gate insulating film is not subjected to a high-temperature treatment for the activation. Accordingly, the amount of material to be added to the gate insulating film can be reduced. Typical examples of such gate insulating films include buried gates or damascene gates. However, this process is valid for all types of procedures for forming a gate insulating film only through a low-temperature treatment.

Figure 11A:
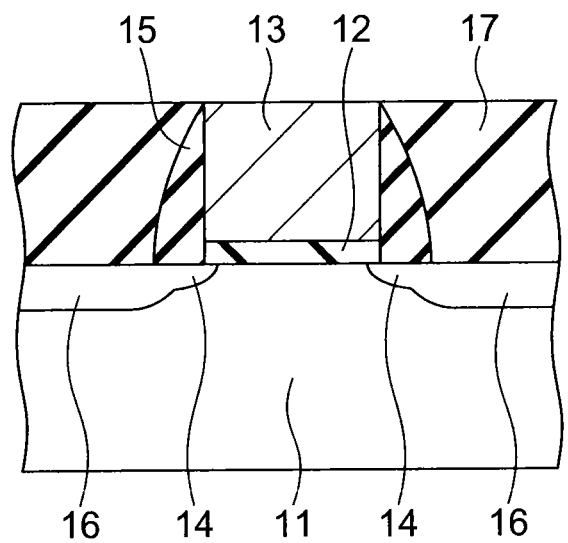
FIGS. 11A and 11B are cross-sectional views illustrating a method for manufacturing a MISFET having a damascene gate structure.
Figure 11B:
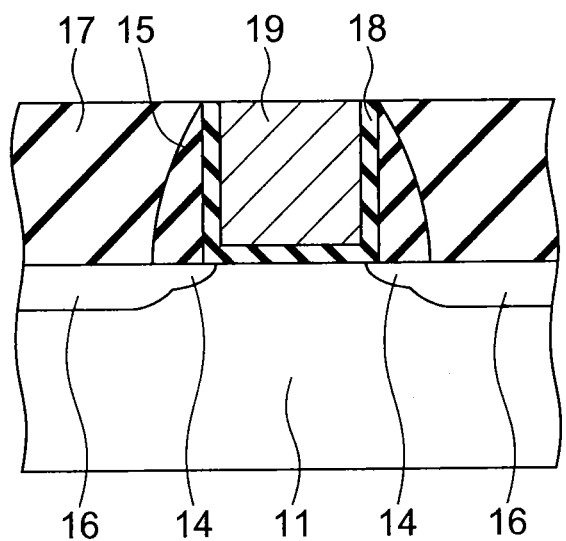

Referring now to FIGS. 11A and 11B, a method for forming a damascene gate is described. First, as shown in FIG. 11A, a dummy gate insulating film 12 and a dummy gate electrode 13 are formed on a silicon substrate 11. With the dummy gate electrode 13 serving as a mask, impurities are introduced into the silicon substrate 11, to form extension regions 14. After that, gate sidewalls 15 formed with insulating films are provided at the side portions of the dummy gate electrode 13. With the gate sidewalls 15 and the dummy gate electrode 13 serving as masks, impurities are introduced into the silicon substrate 11, so as to form source and drain regions 16. A heat treatment is then carried out to activate the introduced impurities. After that, an interlayer insulating film 17 is deposited, and a flattening operation is performed to expose the upper face of the dummy gate insulating film 13 (FIG. 11A). The dummy gate electrode 13 and the dummy gate insulating film 12 are removed, so as to form a concave portion having a bottom face through which the upper face of the silicon substrate 11 is exposed. A gate insulating film 18 is then formed to cover the bottom face and the side faces of the concave portion, and a gate electrode 19 is formed on the gate insulating film 18 to fill the concave portion. As described above, by the method for manufacturing a semiconductor device having a damascene gate, the insulating film 18 does not need to be subjected to high-temperature annealing for activation.

Next, materials that can be used as added materials in place of nitrogen are described.

As described above, nitrogen plays an important role when hydrogen is introduced into an insulating film. However, it is possible to achieve exactly the same effects as above by introducing cations (positive ions) with lower valence than the metal serving as a parent structure of a metal oxide. This is now described in the following.

Figure 12:
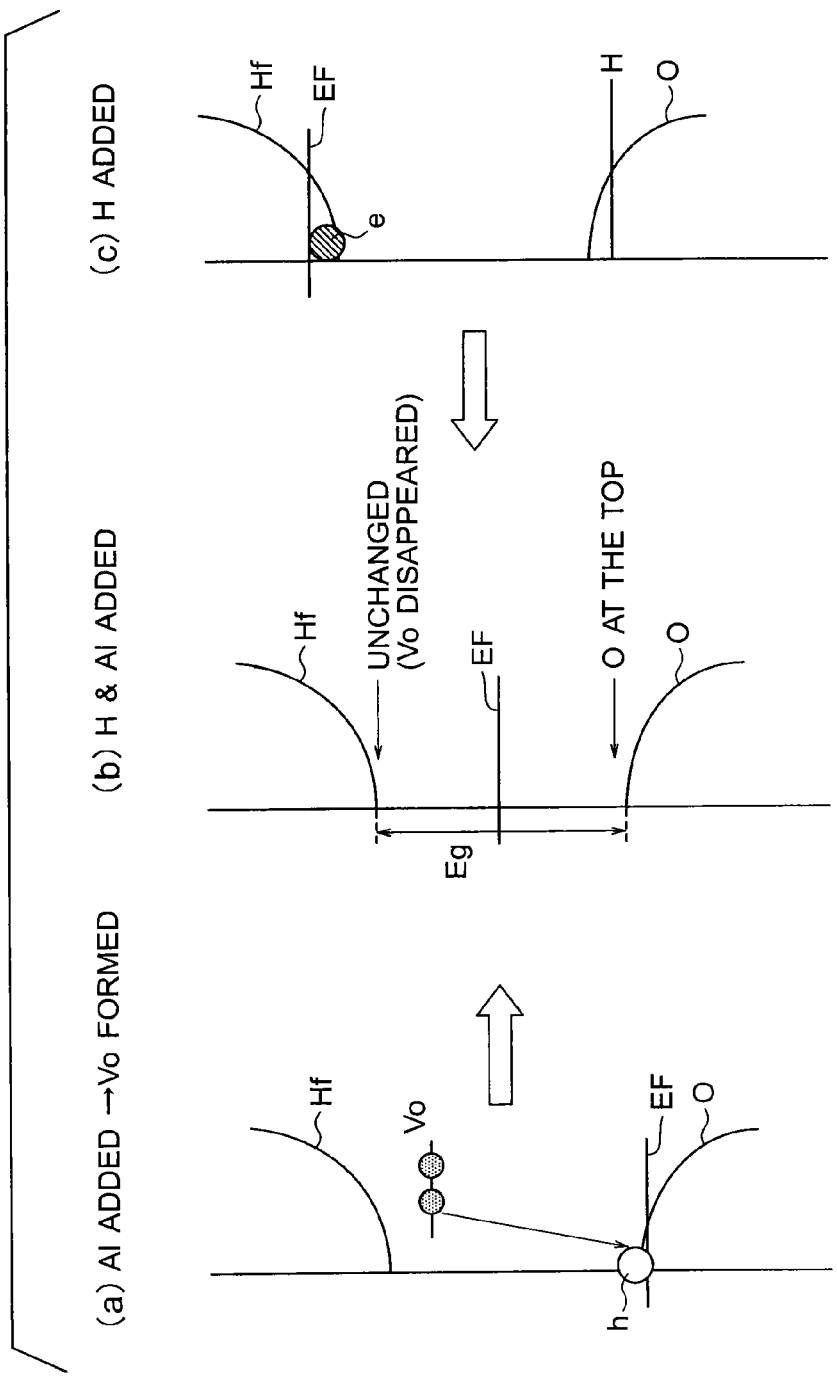
FIGS. 12(a) to 12(c) illustrate the effect achieved when aluminum Al is added to a high-dielectric film, the effect achieved when hydrogen H is added, and the effect achieved both are added.

In this embodiment, oxygen defects are formed due to nitrogen, and hydrogen is buried in the oxygen defects. The entire insulating film is then stabilized. However, there is also a process in which a low-valence metal element is introduced to form oxygen defects, and hydrogen atoms are buried in the oxygen defects. The first-principles calculation has made it clear that the entire structure turns into a most stable structure through the process. A case where aluminum Al, instead of Hf, is introduced into a HfO$_2$ film is now described. FIGS. 12(a) to 12(c) show the results of the experiment, and the results are very much like the results obtained in the case of nitrogen (FIGS. 2(a) to 2(c)).

As shown in FIG. 12(a), only three electrons are released in the case of Al, though four electrons are released in the case of Hf. As a result, the case of Al is short by one electron, and an electron hole (a hole h) is formed on the top of the valence band (VB). At this point, oxygen defects Vo are formed. If there is an extra electron e, the electron fills the electron hole h in the vicinity of the top of the VB. Accordingly, the entire energy becomes lower. This is the mechanism of the formation of oxygen defects caused by Al introduction, from the viewpoint of a micro electronic state. FIG. 12(c) shows a state observed in a case where only H is added.

If a large amount of Al is introduced, phase separation might be caused due to the difference in lattice constant. This is regarded as a phenomenon caused by oxygen defects that move around freely. As shown in FIG. 12(b), hydrogen fills up the oxygen defects. Therefore, even when a large amount of Al is introduced, phase separation can be avoided. Phase separation triggered by displacement of oxygen defects is also caused in a case where a low-valence element having a large ion radius, such as La. However, even when La is introduced, phase separation can also be avoided through the same mechanism as that used in the case of Al. The avoidance of phase separation is one of the effects achieved by eliminating oxygen defects by hydrogen introduction.

At this point, the band offsets ΔEc and ΔEv also become better than those in the case of nitrogen. In the case of nitrogen, the band offset ΔEv is increased due to the nitrogen. In the case of Al, the increase is not caused, and there is not a problem with the band offset ΔEv. Further, since the energy level of H exists lower than the energy level of oxygen, the entire energy is pulled downward (FIG. 12(b)). Accordingly, the band offset ΔEv becomes larger, and better characteristics are achieved. However, the cause of the decrease of the band offset ΔEc is the oxygen defects, which is exactly the same as the cause of the decrease in the case of nitrogen. Accordingly, the range of the band offset ΔEc is exactly the same as that in the case of nitrogen. To sum up, it is preferable that the amount of oxygen defects is equal to or smaller than 1.1 atomic % ($1.0 \times 10^{21}$ cm$^{-3}$ in density), and it is more preferable that the amount of oxygen defects is equal to or smaller than 0.31 atomic % ($3.0 \times 10^{20}$ cm$^{-3}$ in density).

Figure 13:
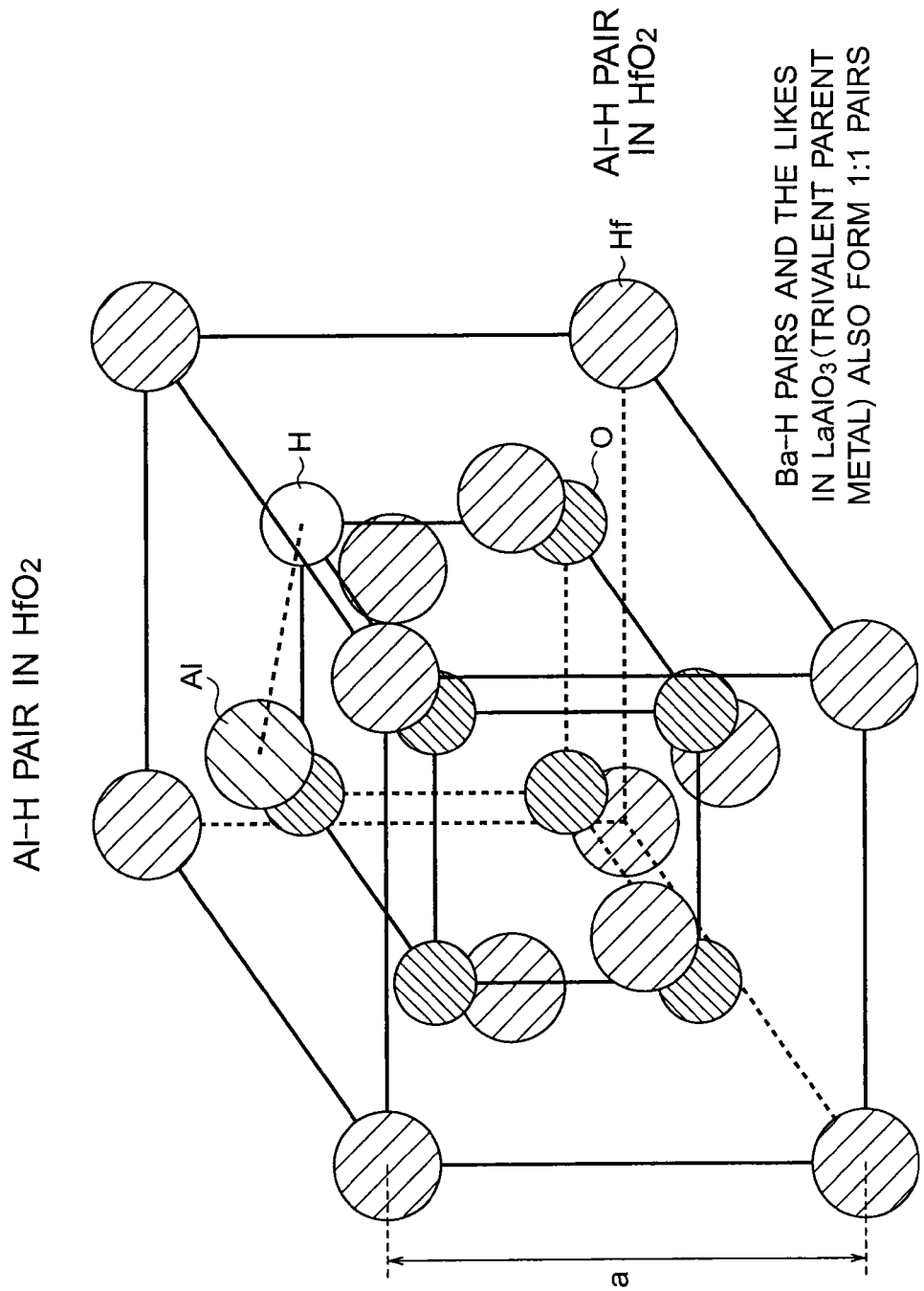
FIG. 13 shows a lattice structure that has pairs of Al (a trivalent metal) and H introduced into a $HfO_2$ film.
Figure 14:
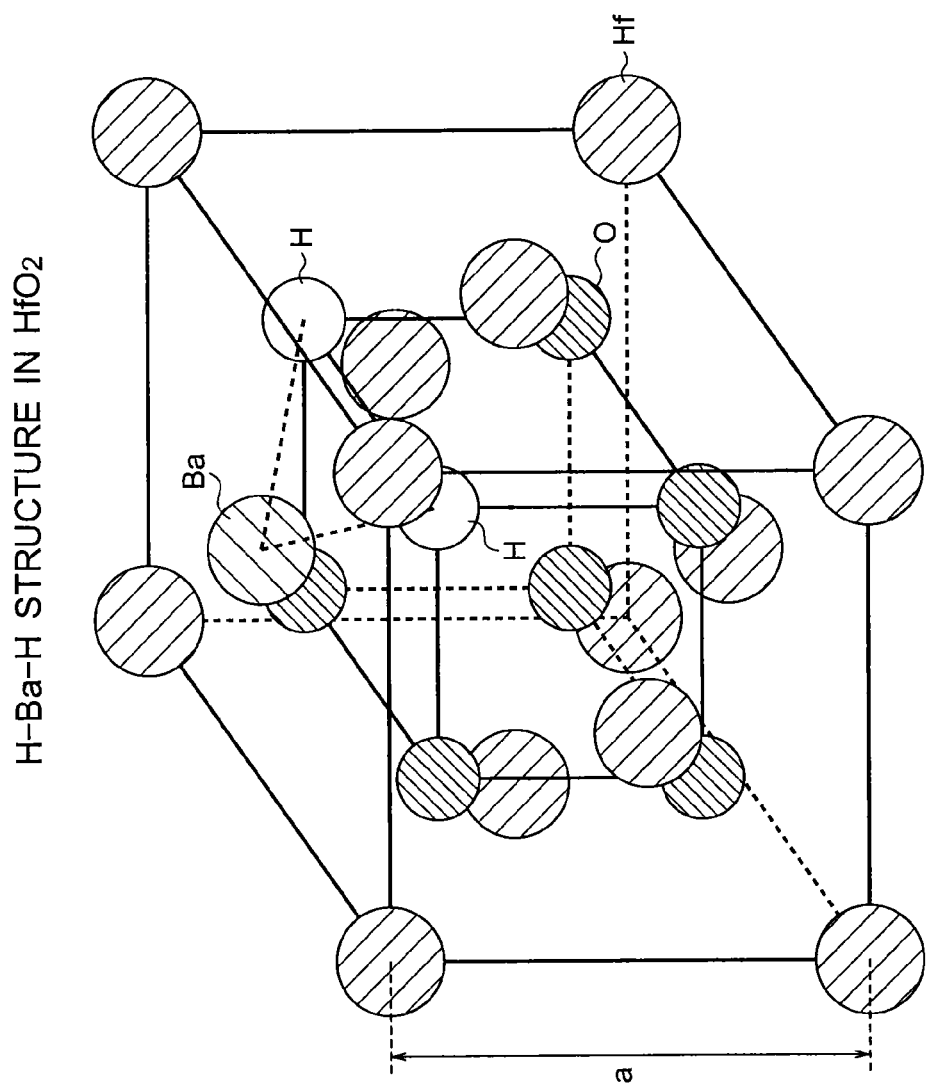
FIG. 14 shows a lattice structure that has bonds of H, Ba (a divalent metal), and H introduced into a $HfO_2$ film.
Figure 15:
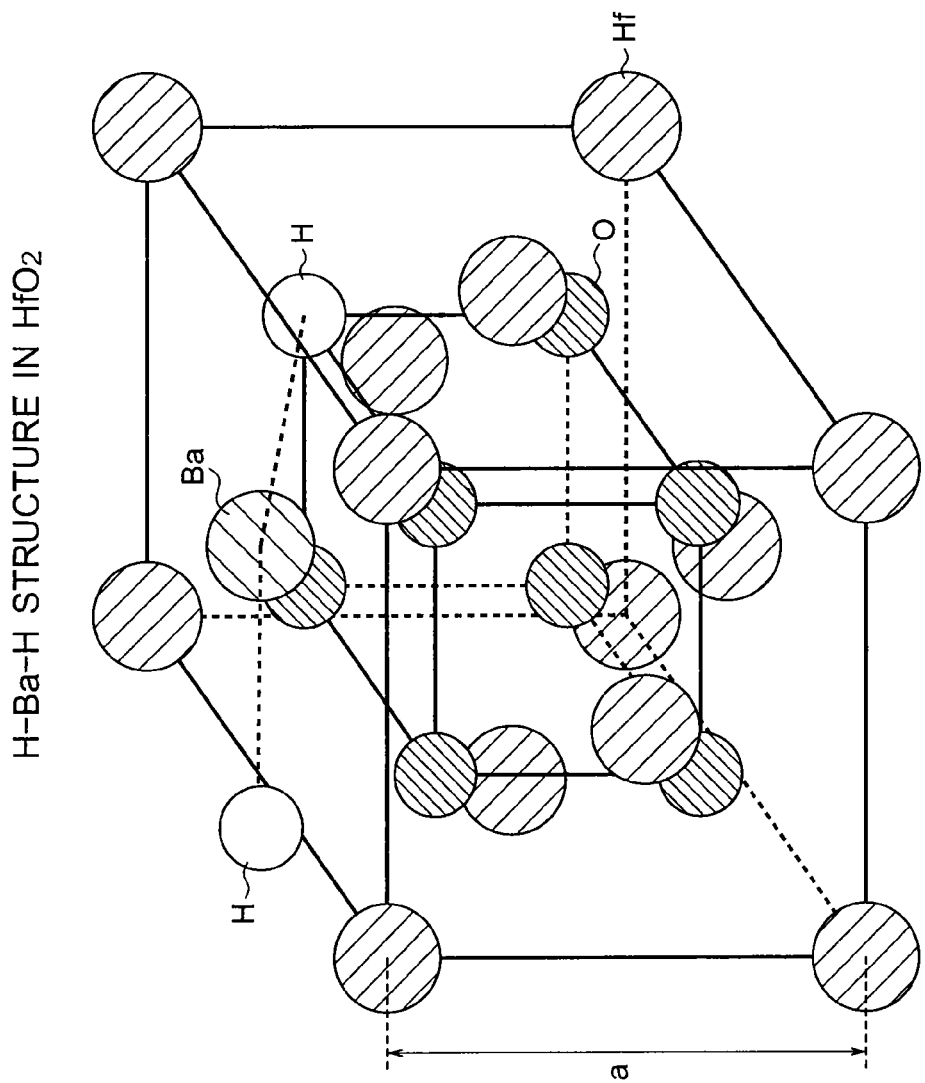
FIG. 15 shows another lattice structure that has bonds of H, Ba (a divalent metal), and H introduced into a $HfO_2$ film.
Figure 16:
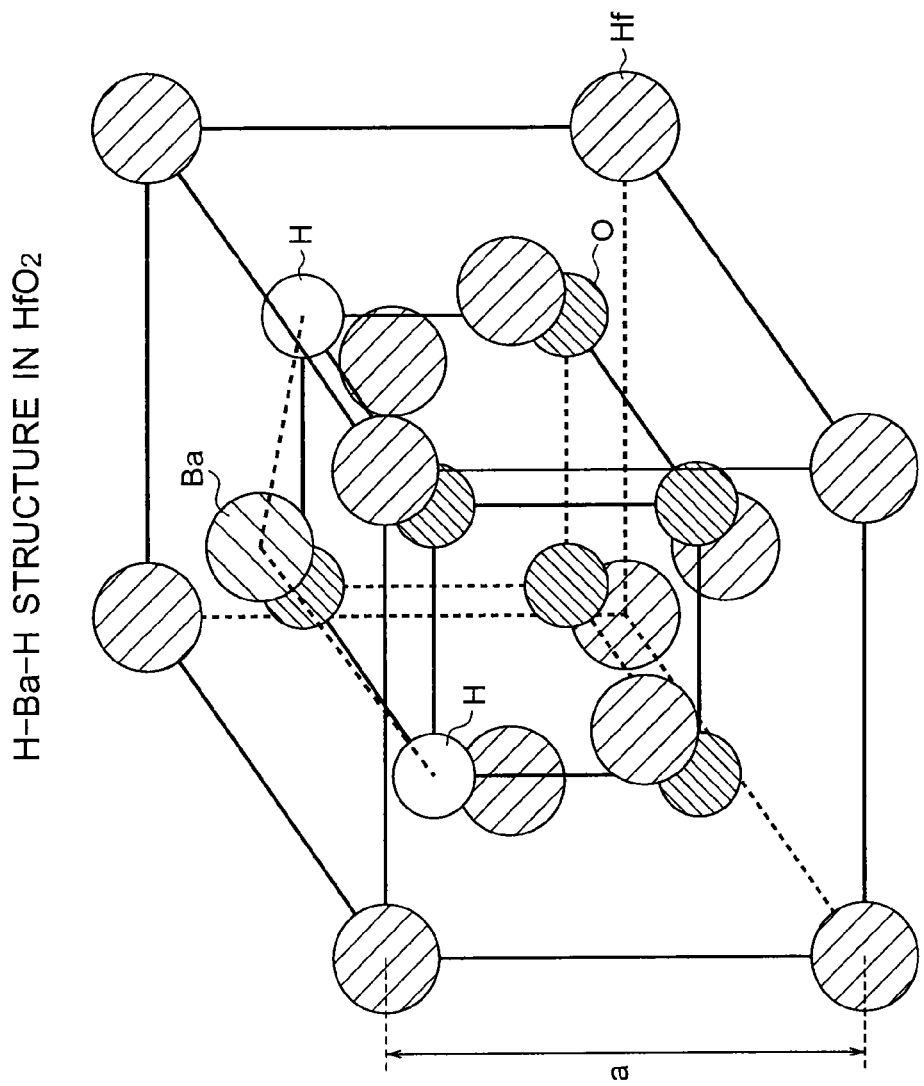
FIG. 16 shows yet another lattice structure that has bonds of H, Ba (a divalent metal), and H introduced into a $HfO_2$ film.

FIG. 13 shows a structure obtained in a case where Al (a trivalent metal) is added to HfO$_2$. One of the Hf atoms is substituted by Al, and H fills up an oxygen defect. Al and H become adjacent to each other and form a pair. As will be described later with reference to FIG. 18, a Ba—H pair or the like in LaAlO$_3$ (a trivalent parent metal) is also a 1:1 pair. FIG. 14 shows a structure observed in a case where Ba as a divalent metal element is introduced into HfO$_2$. This structure has a combined form of H, Ba, and H adjacent to one another. Another example structure of the structure shown in FIG. 14 is has H, Ba, and H aligned almost in a straight line. FIG. 15 shows such an example structure. If one of the H atoms exists in an oxygen position in an adjacent unit cell, this structure is formed. As shown in FIG. 16, the oxygen existing on a diagonal line in the same plane formed with oxygen might be replaced with H. Since eight oxygen atoms exist at equal intervals and surround Ba, two of the oxygen atoms are replaced with H.

To achieve the effects of this embodiment, {[Al]—[H]}/2 should be 8.33 atomic % or less, since the amount of oxygen defects should be {[Al]—[H]}/2. To maintain the structure as a dielectric structure, the hydrogen amount [H] should be half or less than half the oxygen amount, or 33.4 atomic % or less, since [H] replaces the oxygen position. To maintain the structure as a dielectric structure, the aluminum amount [Al] should be half or less than half the Hf amount, or 16.7 atomic % or less, since [Al] replaces the Hf positions. The optimum amount is still achieved when [Al] is equal to [H]. This value is considered to be the value obtained when two Al atoms are introduced into an a×a×a unit. With the interaction between Al atoms being taken into consideration, the interaction becomes stronger and affects the valence band VB when two or more Al atoms are introduced into a 2a×2a×2a unit. In this case, the offset on the VB side tends to become larger. This increase is an effective increase to restrict the leakage to be caused by holes, but leads to a decrease in dielectric constant. Therefore, it is desirable that two or less Al atoms (or some other low-valence material) are introduced into a 2a×2a×2a unit. To sum up, the amount of the material to be added to $HfO_2$ should be equal to or smaller than 16.7 atomic % ($1.6 \times 10^{22}$ cm$^{-3}$ in density), and more preferably, be equal to or smaller than 2.2 atomic % ($2.0 \times 10^{21}$ cm$^{-3}$ in density).

Further, with entropy being taken into consideration, it is preferable that the lower limit of the amount of [trivalent element] is equal to or larger than $6.4 \times 10^{19}$ cm$^{-3}$, and it is more preferable that the lower limit of the amount of [trivalent element] is equal to or larger than $3.0 \times 10^{20}$ cm$^{-3}$, as already mentioned. To sum up, in an oxide of a quadrivalent metal, it is preferable that the following relationship is satisfied:

$$6.4 \times 10^{19} \text{ cm}^{-3} \leq \{\text{trivalent element}\} \leq 1.6 \times 10^{22} \text{ cm}^{-3}$$

and it is more preferable that the following relationship is satisfied:

$$3.0 \times 10^{20} \text{ cm}^{-3} \leq \{\text{trivalent element}\} \leq 2.0 \times 10^{21} \text{ cm}^{-3}$$

As for the substitution, the essential condition for maintaining a dielectric structure is that the substitution is restricted to half or less than the amount of position ions (cations) and the amount of negative ions (anions). Some examples are now described. Since $HfO_2$ is formed with 33.3 atomic % of cations and 66.7 atomic % of anions, the respective upper limits are 16.7 atomic % and 33.4 atomic %, which are half the cation and anion amount.

Figure 17:
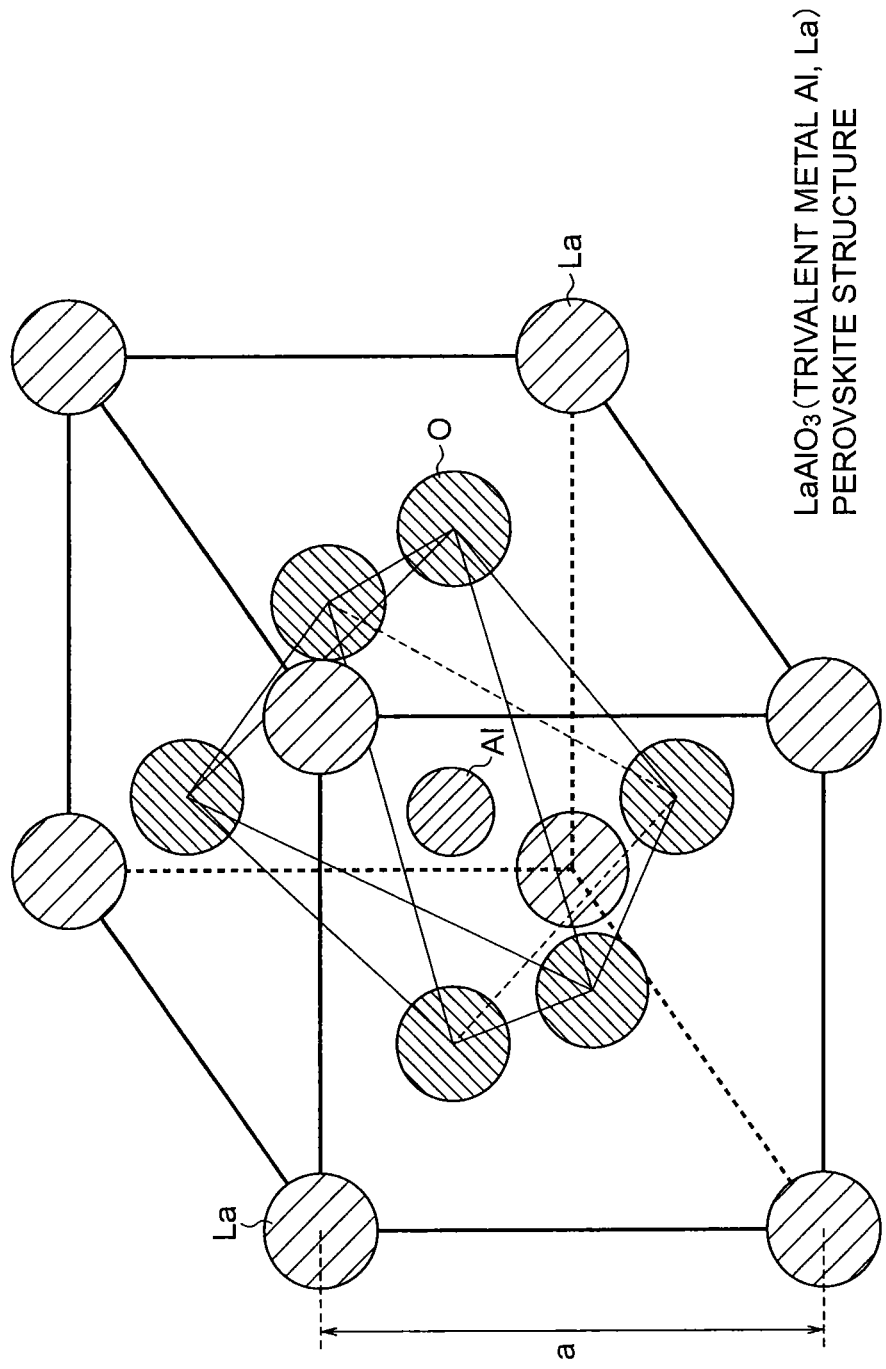
FIG. 17 shows a crystalline structure of a $LaAlO_3$ perovskite structure.
Figure 18:
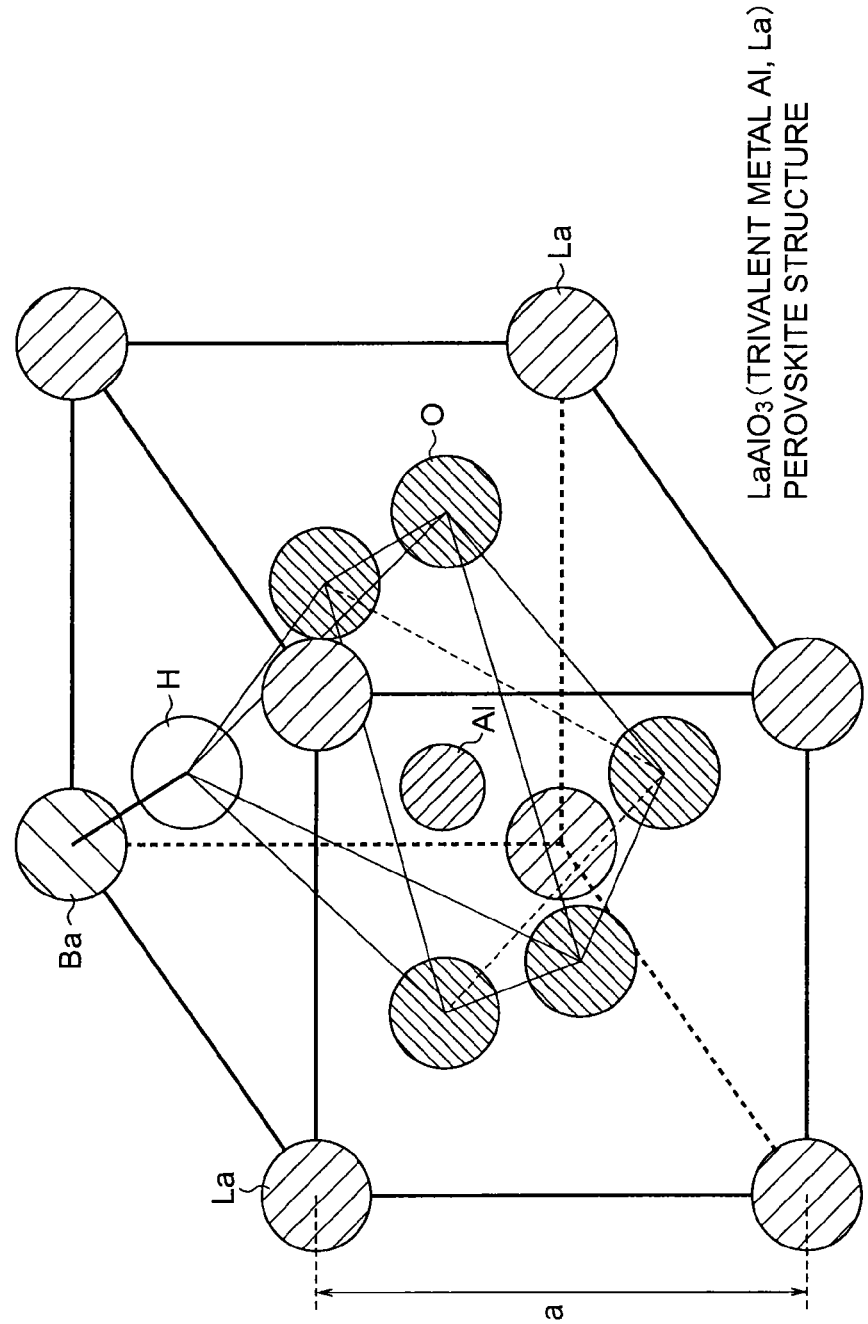
FIG. 18 shows a crystalline structure that is formed when Ba—H are introduced into the perovskite structure shown in FIG. 17.

FIGS. 17 and 18 show the structures of $LaAlO_3$ as perovskite structures. Since the cations to be substituted are La and Al (FIG. 17), the amounts of cations are 20 atomic % each, and the amount of anions is 60 atomic %. Accordingly, (10+10) atomic % and 30 atomic % are the respective upper limits. For example, in a case where Ba and H are introduced into $LaAlO_3$ (FIG. 18), the following conditions should be satisfied: 0≤[Ba]≤20 atomic % (largest), and 0≤[H]≤30 atomic %. In this case, Ba is introduced in place of a trivalent metal element La or Al, and H is introduced in place of O. To prevent a decrease of the dielectric constant, it is preferable that the Ba amount (or Mg, Ca, or Sr amount) is equal to or less than the amount of added Al in the $HfO_2$. This applies to any oxide. To sum up, the amount of the material to be added to $LaAlO_3$ should be equal to or smaller than (10.0+10.0) atomic % ($1.6 \times 10^{22}$ cm$^{-3}$ in density), and more preferably, be equal to or smaller than $2.0 \times 10^{21}$ cm$^{-3}$. Here, it is obvious that 20 atomic %, which is half the sum of the La amount and the Al amount, and the upper limit in an oxide (the value with which the interaction in the valence band becomes remarkably large) are the same as each other in density. This phenomenon is not coincidental, and indicates that the amount of the addition observed immediately before the breaking of an oxide is the same as the amount of the addition with which the interaction in the valence band becomes remarkably large.

Further, with entropy being taken into consideration, it is preferable that the lower limit of the amount of [divalent element] is equal to or larger than $6.4 \times 10^{19}$ cm$^{-3}$, and it is more preferable that the lower limit of the amount of [divalent element] is equal to or larger than $3.0 \times 10^{20}$ cm$^{-3}$, as already mentioned. To sum up, in an oxide of a trivalent metal, it is preferable that the following relationship is satisfied:

$$6.4 \times 10^{19} \text{ cm}^{-3} \leq [\text{divalent element}] \leq 1.6 \times 10^{22} \text{ cm}^{-3}$$

and it is more preferable that the following relationship is satisfied:

$$3.0 \times 10^{20} \text{ cm}^{-3} \leq [\text{divalent element}] \leq 2.0 \times 10^{21} \text{ cm}^{-3}$$

Now, a case where Ca is used is described. It is a known fact that, in many materials such as Ca and Y, oxygen defects easily move and form ion conductors, and crystallization easily occurs. As a result, only a gate insulating film having poor reliability can be obtained due to the mobility of oxygen defects and trapped charges. With hydrogen introduction, however, oxygen ions are certainly prevented from moving, and the material used as the ion conductors can be used as the gate insulating film. Furthermore, the band offsets ΔEv and ΔEc of the materials such as Ca and Y and the material having hydrogen introduced thereto are as good as or better than the band offsets observed in the case of Al. As for the optimum amounts, the optimum amount of Y in $HfO_2$ is the same as the Al amount in the above $HfO_2$, and the optimum amount of Ca in $HfO_2$ is the same as the Ba amount in the $HfO_2$.

Further, a case where Ba as a divalent material is added to an oxide of a quadrivalent material is described. The addition of Ba is originally the most expected choice. When hydrogen is introduced, however, Ba becomes dissociated from oxygen defects, and there is no need to take the oxygen defects into consideration. Thus, the characteristics are greatly improved. Particularly, the amount of the addition is not limited to a small amount as in conventional cases, and the same amount as in the nitrogen case can be introduced. As for the amount of oxygen defects, however, (valence difference "2")×[divalent element], instead of [N], is assigned into the numerical expression, if the valence difference is 2. This means that the same amount of hydrogen as a multiple of the valence difference is required.

Accordingly, {2×[divalent element]-[H]}/2 is the amount of oxygen defects. It is preferable that the following relationship is satisfied:

$$\{2 \times [\text{divalent element}] - [H]\}/2 \leq 1.0 \times 10^{21} \text{ cm}^{-3}$$

and it is more preferable that the following relationship is satisfied:

$$\{2 \times [\text{divalent element}] - [H]\}/2 \leq 3.0 \times 10^{20} \text{ cm}^{-3}$$

Further, with entropy being taken into consideration, it is preferable that the lower limit of the amount of [divalent element] is equal to or larger than $6.4 \times 10^{19}$ cm$^{-3}$, and it is more preferable that the lower limit of the amount of [divalent element] is equal to or larger than $3.0 \times 10^{20}$ cm$^{-3}$, as already mentioned.

In the divalent metal in an oxide of a quadrivalent metal, there is an electron shortage by two electrons due to substitution. Therefore, the divalent metal and oxygen defects form 1:1 pairs. As a result, the optimum density of the divalent metal is half the optimum density obtained in the case of 2:1 pairs (a "NVN" structure or an "AlVAl" structure). Accordingly, it is preferable that the optimum density of the divalent metal is equal to or smaller than $0.8 \times 10^{22}$ cm$^{-3}$, and it is more preferable that the optimum density of the divalent metal is equal to or smaller than $1.0 \times 10^{21}$ cm$^{-3}$. This has already been mentioned in the description of the upper limit of the nitrogen amount.

To sum up, in an oxide of a quadrivalent metal, it is preferable that the following relationship is satisfied:

$$6.4 \times 10^{19} \text{ cm}^{-3} \leq [\text{divalent element}] \leq 0.8 \times 10^{22} \text{ cm}^{-3}$$

and it is more preferable that the following relationship is satisfied:

$$3.0 \times 10^{20} \text{ cm}^{-3} \leq [\text{divalent element}] \leq 1.0 \times 10^{21} \text{ cm}^{-3}$$

The amount of addition is basically determined by the valence difference between the parent metal and the metal to be added. The optimum amount is 2[Ba]=[H]. It is preferable that {2[Ba]—[H]}/2 is equal to or smaller than 8.33 atomic %, and it is more preferable that {2[Ba]—[H]}/2 is equal to or smaller than 7.4 atomic %. Further, the conditions, 0≤[Ba]≤16.7 atomic % and 0≤[H]≤33.4 atomic %, are the same as those in the case of Al.

As described above, when a material having lower valence than the valence of the parent metal is introduced, oxygen defects are formed, and hydrogen fills up the oxygen defects. The same applies to many kinds of materials.

Optimum examples of metal elements having quadrivalent parent metals include Hf, Zr, and Ti, and at least one of the elements should be used. In this case, the material to be added is a trivalent metal element or a divalent metal element. Examples of trivalent metal elements include La and Al. Those trivalent metal elements originally tend to have phase separation due to the ion radius, but the phase separation is caused because the oxide is stable. As hydrogen is introduced, the possibility of phase separation becomes zero. With the ion radius and stability being taken into consideration, La and Al are most effective.

Also, the group of elements Sc, Y, Ce, Pr, Nd, Pm, Sm, Eu, Gd, Tb, Dy, Ho, Er, Tm, Yb, and Lu are also effective. Those are the elements that have the possibility to form ion conductors. However, with hydrogen being introduced, there are no possibilities that those elements form ion conductors. This embodiment has proved for the first time that those elements are normally unsuitable as insulating films, but can exhibit excellent characteristics as insulating films after hydrogen is introduced. Materials having any of those elements introduced thereto have very high structural stability, and are very useful accordingly.

Optimum examples of divalent metal elements include Mg, Sr, and Ba. Those elements have the problem of becoming dissociated from oxygen defects, and therefore, can be introduced only with low concentration. However, those problems disappear once hydrogen is introduced. Also, Ca can be used. Ca is a material that might form ion conductors, but has no possibilities to form ion conductors once hydrogen is introduced. Materials having any of those elements introduced thereto have very high structural stability, and are very useful accordingly.

Optimum examples of trivalent metal elements as parent metals include La, Al, and Y, and at least one of those elements should be used. For example, $LaAlO_3$, $YAlO_3$, $La_2O_3/Al_2O_3/Y_2O_3$/and the likes are effective, in terms of stability and dielectric characteristics. The material to be added to an oxide having any of those trivalent parent metals may be a divalent element (Ba, Sr, Ca, or Mg).

Also, silicates (such as $HfSiO_4$ and $LaAlSiO_5$) may be used as parent metal oxides. In a silicate, an added material such as nitrogen might exist only on the silicon side. This is probably because higher stability is maintained when N exists locally in $SiO_2$ rather than when N exits in a parent material such as $HfO_2$ or $LaAlO_3$. As hydrogen is introduced, a hydrogen structure is formed in $HfO_2$ or $LaAlO_3$, and high stability is achieved. Accordingly, nitrogen moves toward the $HfO_2$ or $LaAlO_3$ side, and the above effect is achieved. In this manner, a large effect is achieved even in a silicate.

Next, the difference between the H addition employed in this embodiment and the FGA process is described.

In the LSI process, FGA ($H_2$ annealing) is often used. The H in an insulating film is to recover a very small amount of defects caused in the initial stage of the film formation, with the use of a very small amount of hydrogen. More specifically, the hydrogen fills up unstable oxygen defects Vo existing independently of other parts, and releases excess oxygen to the outside. However, the hydrogen does not fill up oxygen defects in a stable "NVoN" structures or "BaVo" structure. Rather, this process is regarded as the process of producing those stable "NVoN" and "BaVo" structures (JP-A 2007-273587 (KOKAI)). Unlike the process in accordance with this embodiment, FGA ($H_2$ annealing) is not a process in which nitrogen or a low-valence metal element is introduced, and an optimum amount of hydrogen excited in an atomic state is introduced by virtue of stabilization achieved by the movement of electrons caused by charge compensation. Therefore, the amount of hydrogen introduced into the film is also very small. In this embodiment, on the other hand, an interaction is caused between oxygen defects formed through the introduction of nitrogen or a low-valence metal element and hydrogen excited in an atomic state, and a stable structure is established. In this manner, this embodiment provides a novel film that does not cause decreases in the band offsets ΔEc and ΔEv due to the introduction of nitrogen or a low-valence metal element. To realize the structure of this embodiment, H excited in an atomic state is preferable to $H_2$ in a molecular state.

In the process of manufacturing a semiconductor device, the surface of a Si substrate is sometimes terminated with H. In that case, hydrogen having area density in the order of $10^{14}$ $cm^{-2}$ exists in the interface region. Normally, the hydrogen in the interface region is removed from the termination during the film formation, and is discharged from the film forming apparatus. Accordingly, the amount of hydrogen remaining in the insulating film should be almost zero, and be in the order of $10^{18}$ $cm^{-3}$ or less in density. In a regular process, hydrogen is released to the outside through a heat treatment, and the amount of hydrogen in the insulating film is reduced as much as possible. After that, H is absorbed at the interface between the substrate and the insulating film after the $H_2$ annealing, but there are little hydrogen existing in the film.

As described so far, in accordance with this embodiment, oxygen defects can be restricted as much as possible, and the leakage current can be reduced. Thus, an insulating film with high reliability can be obtained.

Next, the embodiment is described in greater detail through the following examples.

Example 1

Figure 19:
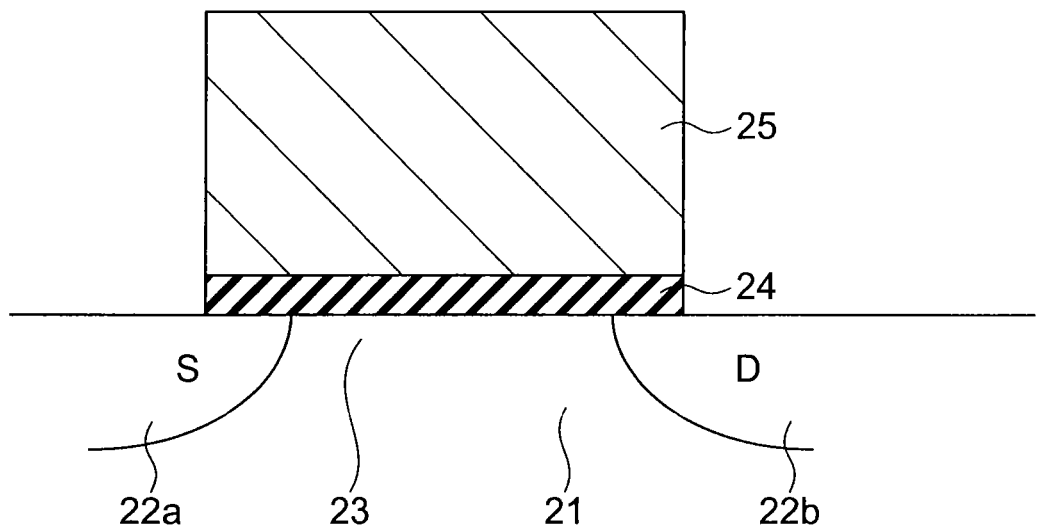
FIG. 19 is a cross-sectional view of a MISFET of Example 1.

FIG. 19 illustrates an n-type MISFET in accordance with Example 1. The MISFET of Example 1 has the oxide film of the above embodiment as a gate insulating film.

In the MISFET of Example 1, an n-type source and drain regions 22a and 22b are formed at a distance from each other on a p-type Si substrate 21, and a gate insulating film 24 is formed on a portion of the silicon substrate 21. The portion is to be a channel region 23 between the source region 22a and the drain region 22b. A gate electrode 25 is formed on the gate insulating film 24.

Next, the procedures for manufacturing the MISFET of Example 1 are described. First, the clean surface of the Si substrate 21 having a (001)-plane as the principal surface is revealed. In this procedure, a regular HF (hydrofluoric acid) treatment is carried out, and an extremely thin oxide film $SiO_2$ is formed through room-temperature ozone oxidation. Surface protection is then conducted.

The Si substrate 21 is then transported to a sputtering device, and the impurities in the outermost surface evaporate in a ultrahigh vacuum at 250° C. The temperature is then increased to 880° C., so that the oxide film $SiO_2$ in the surface evaporates. At this point, the clean surface appears, and the surface has a 2×1 structure, as can be observed through reflection high-energy electron diffraction (RHEED).

The amorphous $HfO_2$ film as the gate insulating film 24 is then formed by sputtering at a low temperature of 300° C. The film thickness of the $HfO_2$ film is 4 nm. Here, the oxygen partial pressure is set at zero since the initial stage of the sputtering film formation, and the film formation is performed in a reduced atmosphere of an atmosphere having plasma nitrogen and plasma hydrogen introduced thereto. Alternatively, plasma nitrogen and plasma hydrogen may not be introduced during the $HfO_2$ film formation, and plasma nitrogen may be introduced after the $HfO_2$ film is formed. Plasma hydrogen may be then introduced. In such a case, however, oxygen is released from the $HfO_2$ film. Therefore, the plasma nitrogen and hydrogen introduction should be performed while the $HfO_2$ film is not covered with an electrode or the like, so as to prevent oxygen from entering the interface with the silicon substrate.

With this arrangement, the amount of nitrogen to be introduced and the amount of hydrogen to be introduced can be controlled by adjusting the amount of plasma, the time of exposure to plasma, and the plasma temperature. In this example, films are formed, with the nitrogen amount being varied from 0.1 atomic % ($9.6 \times 10^{19}$ $cm^{-3}$ in density), to 2.0 atomic % ($1.9 \times 10^{21}$ $cm^{-3}$ in density), and to 10.0 atomic % ($9.6 \times 10^{21}$ $cm^{-3}$ in density). The amount of hydrogen to be introduced also varies with the time of exposure to plasma hydrogen. If the time of exposure to plasma hydrogen is too short, oxygen defects are dispersed in the film, and result in a leakage current. Since electrons are trapped by oxygen defects when hydrogen is introduced to a certain level, the film is negatively charged. The amount of oxygen defects at this point can be determined by carrying out STS measurement on the film or observing the threshold value variation in a MOS structure. If the amount of oxygen defects becomes less than 1.1 atomic % ($1.0 \times 10^{21}$ $cm^{-3}$ in density), the leakage current is reduced to an allowable level. (When the amount of oxygen defects is 0.31 atomic % ($3.0 \times 10^{20}$ $cm^{-3}$ in density), the leakage current is reduced to 10 times as much as the saturation leakage current.) If the amount of oxygen defects becomes less than 0.31 atomic %, almost no leakage current flows. The amount of oxygen defects may be reduced further. However, the leakage characteristics hardly change if the amount of oxygen defects becomes less than 0.31 atomic % and decreases even further. In other words, the leakage current has reached the saturation point, and reflects the performance of the $HfO_2$ film. However, if electrons are accumulated at oxygen defects, a threshold value shift in the MOS structure is observed. Accordingly, the amount of oxygen defects can be even more precisely measured by checking whether there is a threshold value shift. By introducing a sufficient amount of hydrogen atoms, film formation is performed while the amount of oxygen defects is further reduced. Where the ratio between the nitrogen amount and the hydrogen amount is 1:1, the most stable state is achieved, and extra hydrogen can be released to the outside. Accordingly, the amount of oxygen defects can become zero in principle. In such a case, a threshold value shift hardly occurs in the MOS structure that is observed for a threshold value shift, as will be described later.

After that, 30-second rapid thermal annealing (RTA) is performed in a vacuum at 900° C. A polysilicon film to be the gate electrode is then formed, and processing is performed to turn the polysilicon film into the gate electrode 25. After sidewalls are formed (not shown), electrode ion implantation (P ions) is performed, followed by spike annealing at 1050° C. and $H_2$ sintering, in a case where ions are injected into the source and drain regions while polysilicon is used for an electrode. In a case where a metal electrode is used, a metal film is formed after the source and drain are activated. The results of the secondary ion mass spectrometer (SIMS) analysis conducted on the distributions of the hydrogen concentration and the nitrogen concentration in the gate insulating film 24 where the nitrogen amount is 2.0 atomic % are represented by the graphs shown in FIG. 10. In the gate insulating film 24, the hydrogen concentration distribution and the nitrogen concentration distribution overlap with each other, and may be regarded as the same as each other, in view of the precision of the SIMS analysis. Here, a large amount of hydrogen exists in the interface between the Si substrate 21 and the insulating film 24. This is because the dangling bonds in the surface of the substrate 21 are terminated. This indicates that hydrogen can be located in the vicinity of nitrogen at the ratio of 1:1 inside the gate insulating film 24 formed by the film forming method of this example. As can be seen from the SIMS analysis results, better characteristics can be achieved when a larger amount of added material is distributed on the electrode side. Nitrogen and hydrogen are electrically charged in the bulk, and the charge amount becomes zero when N and H form pairs. The charge amounts of both materials are hardly visible at a location far away from the channel region 23, but positively-charged and negatively-charged distributions can be seen at a location close to the channel region 23. Therefore, the distribution of N—H pairs should be minimized in the portion equivalent to an insulating film layer in the vicinity of the channel region 23 or in a region of approximately 2.5 angstroms in the vicinity of the channel region 23. An insulating film that has fewer N—H pairs in the interface with the silicon substrate can be readily realized by controlling the procedures of nitridation and hydrogenation. For example, the amounts of excited nitrogen and excited hydrogen may be set at zero in the initial stage of the film formation, and be gradually increased. Also, if plasma nitridation and plasma hydrogenation are performed after the formation of the $HfO_2$ film, a film that has high concentration in the upper film portion and low concentration in the vicinity of the substrate can be readily realized. As shown in FIG. 10, a mobility comparison is made between a MOSFET that has high N and H concentration in the insulating film 24 but low N and H concentration in the vicinity of the silicon substrate, and a MOSFET that has N and H introduced uniformly into the entire insulating film and has N—H pairs distributed in large number even in the interface between the Si substrate and the insulating film. According to the comparison, the difference in mobility between the two MOSFETs is approximately 20%. Therefore, a film that has fewer N—H pairs in the vicinity of the interface with the Si substrate as in Example 1 is considered to be better.

In Example 1, the film formation is performed by a sputtering technique, but the same result can be achieved by MBE, CVD, ALD, or the like.

For n-type MISFETs formed in the above described manner, a characteristic comparison is also made between an n-type MISFET that has hydrogen added thereto and an n-type MISFET that has no hydrogen added thereto. In both MISFETs, the gate insulating film 24 is a thin gate insulating film of 0.65 nm in film thickness (EOT) converted into the film thickness of a $SiO_2$ film.

The leakage current generated when a large electric field of 5 MV/cm is induced is then measured. The leakage current in the MISFET having no hydrogen added thereto is 1.0 A/cm$^2$ or less, but the leakage current in the MISFET having hydrogen added thereto is much lower, being 0.0005 A/cm$^2$. The gate film of the MISFET having no hydrogen added thereto has microcrystals precipitated, but the film of the MISFET having hydrogen added thereto maintains an amorphous state. In the case of the MISFET having hydrogen added thereto, crystallization is caused if the nitrogen amount and the hydrogen amount are as small as approximately 0.1 atomic %, and the leakage current is increased. In the MISFET having the small amounts of nitrogen and hydrogen added thereto, it has become clear that crystallization is not caused if the PDA procedure is carried out at a low temperature of 600° C. for 30 seconds, the $H_2$ sintering is performed at a low temperature of 450° C., and the spike annealing is performed in a vacuum at 1050° C.

A comparative experiment is also conducted on HfON that is an often-used $HfO_2$ film having a large amount of nitrogen added thereto. The nitrogen amount is set at approximately 24 atomic %, which is twice the nitrogen amount in the above example or more. At this point, the original amorphous structure is maintained. However, the leakage current measured when a large electric field of 5 MV/mc is induced is approximately 0.1 A/cm$^2$ in the $HfO_2$ film having only N added thereto. This is only 10% of the leakage current observed in a $HfO_2$ film having no N added thereto, because the amorphous structure is maintained. As described above, it has become clear that the leakage current in the $HfO_2$ film after the hydrogen addition is much lower than the leakage current prior to the hydrogen addition. With only nitrogen being added to a regular HfON film, the band offset ΔEc on the conduction band side decreases by almost 0.5 eV. This is the principal reason that the leakage current characteristics are not sufficiently improved. In Example 1, on the other hand, hydrogen as well as nitrogen is added, and the band offset ΔEc does not decrease. Accordingly, $HfO_2$ can exhibit its inherent characteristics.

As for the time-dependent changes observed while voltages are being applied, the $HfO_2$ film having neither nitrogen nor hydrogen added thereto breaks down within a few hours, and the $HfO_2$ film having nitrogen (24 atomic %) added thereto breaks down in almost eight hours. On the other hand, the $HfO_2$ film having 2.0 atomic % of nitrogen and 2.0 atomic % of hydrogen added thereto does not break down even after several days.

In the MISFET that does not have nitrogen and hydrogen introduced into the gate insulating film, the threshold voltage shifts with time in a remarkable manner, and a shift of 100 mV or larger is observed in approximately one hour. In the MISFET having only nitrogen introduced into the gate insulating film, a shift of 100 mV is observed in eight hours. In the MISFET having only nitrogen added to the gate insulating film, the shift is caused because the fixation of the oxygen defects is weak. In the MISFET having nitrogen and hydrogen introduced into the gate insulating film, only a shift of 10 mV is observed even after several days, and there is hardly a change thereafter. This is because there are no structural changes and no trapped charges that cause oxygen defects as the insulating film characteristics.

Likewise, p-type MISFETs are examined. There is the problem of crystallization in $HfO_2$ alone, and there is a band offset decrease in a p-type MISFET having nitrogen added thereto. However, in an insulating film having 2.0 atomic % of nitrogen and 2.0 atomic % of hydrogen added thereto, a decrease of the band offset is prevented. As a result, a p-type MISFET with excellent leakage characteristics is obtained. Further, as for long-term reliability, the same effects as those of an n-type MISFET are achieved. In a case where 10 atomic % of nitrogen and 10 atomic % of hydrogen are introduced, the leakage in the p-type MISFET becomes approximately ten times larger.

The effects of the addition of both hydrogen and nitrogen into a gate insulating film greatly contribute to improvement of the characteristics of the insulating film. The C-V characteristics (capacitance-voltage characteristics) exhibit an excellent rise, and draw a steep curve. Meanwhile, the hydrogen existing in the interface with the Si substrate causes a shift of the rising point of the C-V characteristics. When combined with the hydrogen adding process, the two aspects can be combined with each other. The shift of the C-V characteristics caused by the hydrogen in the interface has a problem that the rise of the C-V characteristics becomes poor. It is considered that the deformation of the C-V characteristics affects the operation of the MISFET, and degrades the current driving performance. As shown in this example, the rise of the C-V characteristics is improved if hydrogen and nitrogen are introduced into the insulating film. With those aspects being combined, a p-type MISFET that has a shift of the C-V characteristics because of the hydrogen in the channel and also has a very good rise of the C-V characteristics can be obtained.

The effects of the improvement of the film characteristics described so far are that oxygen defects disappear by virtue of hydrogen, the bandgap is not narrowed, and there is not a level appearing in the gap. In accordance with this example, the characteristics and reliability of the gate insulating film are greatly improved.

In this example, HfONH is taken as an example. However, an excellent gate insulating film that has no oxygen defects, no narrowing of the bandgap, and no levels in the gap can be obtained by using $HfO_2$ having H and a trivalent material such as La or Al added thereto, $ZrO_2$ having H and a divalent material such as Ca or Mg added thereto, $LaAlO_3$ having H and a divalent material such as Ba added thereto, or the like.

As described above, in accordance with this example, oxygen defects can be restricted as much as possible, and the leakage current can be reduced. Accordingly, a gate insulating film with high reliability and a MISFET including the gate insulating film can be obtained.

Example 2

Figure 20:
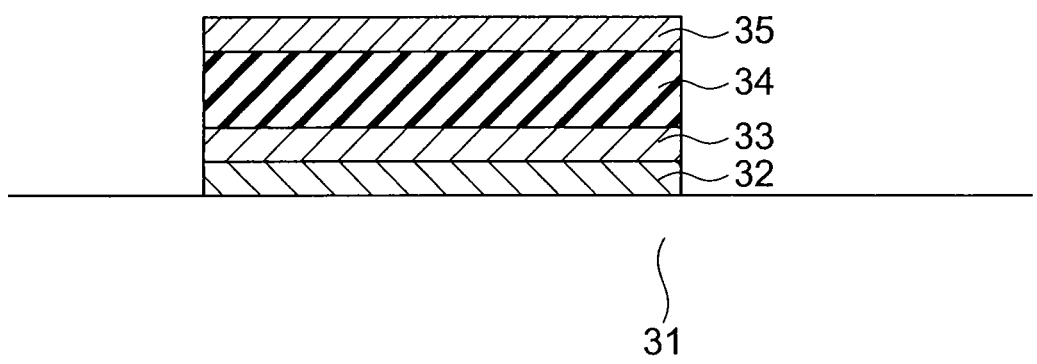
FIG. 20 is a cross-sectional view of a MIM capacitor of Example 2.

FIG. 20 shows a MIM (metal insulator metal) capacitor in accordance with Example 2. The MIM capacitor of Example 2 includes: a buffer film 32 that is made of TiAlN or the like and is formed on a substrate 31; an electrode 33 that is made of Pt and is formed on the buffer film 32; a capacitor insulating film 34 that is formed on the electrode 33; and an electrode 35 that is made of Pt and is formed on the capacitor insulating film 34. The capacitor insulating film 34 is formed with the $HfO_2$ film having La added thereto as described in the above embodiment.

Next, the procedures for manufacturing the MIM capacitor of Example 2 are described. First, through the same procedure as that of Example 1, the clean surface of the substrate 31 having a (001)-plane as its principal surface is caused to appear.

After the buffer film 32 and the electrode 33 are formed in this order, a $HfO_2$ film to be the capacitor insulating film 34 is formed on the electrode 33 by performing sputtering at a high temperature of 800° C. The film thickness of the HfO$_2$ film is 10 nm. The oxygen partial pressure is set at zero since the initial stage of the sputtering film formation.

When the HfO$_2$ film is formed, a target of La$_2$Hf$_2$O$_7$ is introduced, and simultaneous sputtering is performed. The oxygen partial pressure is set at zero since the initial stage of the sputtering film formation, and the film formation is performed in a reduced atmosphere of an atmosphere having plasma hydrogen (or excited hydrogen) introduced thereto. Here, the amount of La to be added is very large, and is approximately 2.0 atomic % (1.9×10$^{21}$ cm$^{-3}$ in density). The amount of La to be added is controlled by adjusting the voltage to be applied to the target. In this example, the film formation is performed by a sputtering technique, but the same result can be achieved by MBE, CVD, ALD, or the like. After that, 30-second RTA is performed at 900° C.

A Pt film to be the electrode 35 is then formed by sputtering. SIMS analysis is conducted on the distributions of the hydrogen concentration and the La concentration in the capacitor insulating film 34. In the capacitor insulating film 34, the hydrogen concentration distribution and the La concentration distribution overlap with each other, and may be regarded as the same as each other, in view of the precision of the SIMS analysis. This indicates that hydrogen can be located in the vicinity of La at the ratio of 1:1, depending on the film formation method in this example.

MIM capacitors are produced in the above manner, and the characteristics of a capacitor having no hydrogen added to the capacitor insulating film and the characteristics of a capacitor having hydrogen added to the capacitor insulating film are examined. First, in each of the capacitors, the capacitor insulating film 34 is a thin gate insulating film of 0.45 nm in film thickness (EOT (Equivalent Oxide Thickness)) converted into the thickness of SiO$_2$.

The leakage current generated when a large electric field of 5 MV/cm is induced is then measured. The leakage current in the capacitor having no hydrogen added thereto is 1.0 A/cm$^2$ or less, but the leakage current in the capacitor having hydrogen added thereto is much lower, being 0.005 A/cm$^2$. There are a large amount of oxygen defects in the HfO$_2$ having La added thereto in the capacitor having no hydrogen added thereto. Since electrons can easily enter and leave oxygen defects, the oxygen defects are considered to be the cause of an increase in leakage current. However, as hydrogen enters the oxygen defects, the cause of the leakage current increase is eliminated.

As for the time-dependent changes observed while voltages are being applied, the capacitor having no hydrogen introduced thereto breaks down within a few hours, but the capacitor having hydrogen introduced thereto does not break down even after several days.

In the capacitor having no hydrogen introduced thereto, charges are accumulated with time, and the results of an examination conducted on the capacitance-voltage (C-V) characteristics indicate that the hysteresis is larger in the increasing and decreasing direction of the applied voltage. In the film having hydrogen introduced thereto, on the other hand, the hysteresis is restricted to 10 mV or less.

The effects of the improvement of the film characteristics described so far are that oxygen defects disappear by virtue of hydrogen, the bandgap is not narrowed, and there is not a level appearing in the gap. In accordance with this example, the characteristics and reliability of the capacitor insulating film are greatly improved.

In this example, HfO$_2$ having La and H added thereto is taken as an example. However, an excellent capacitor insulating film that has no oxygen defects, no narrowing of the bandgap, and no levels in the gap can be obtained by using HfO$_2$ having N and H added thereto, ZrO$_2$ having H and a divalent material such as Ca or Mg added thereto, LaAlO$_3$ having H and a divalent material such as Ba added thereto, or the like.

As described above, in accordance with this example, oxygen defects can be restricted as much as possible, and the leakage current can be reduced. Accordingly, a capacitor insulating film with high reliability and a MIM capacitor including the capacitor insulating film can be obtained.

Example 3

Figure 21:
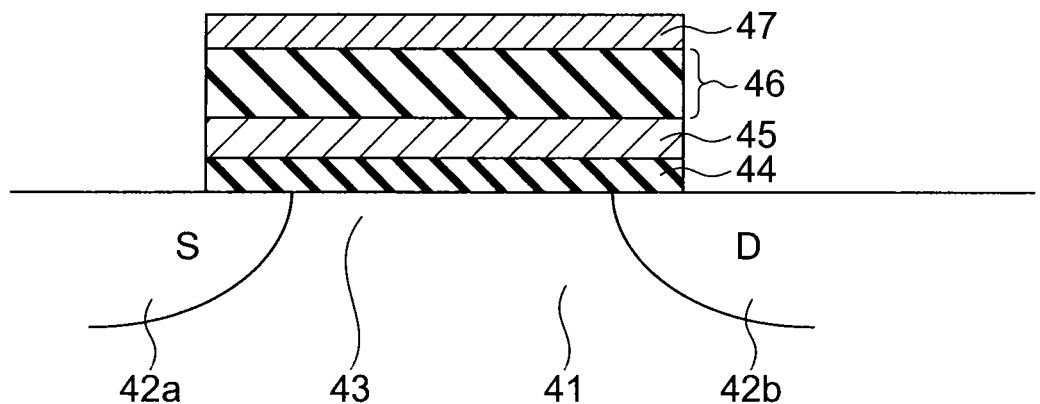
FIG. 21 is a cross-sectional view of a memory cell transistor of Example 3.

FIG. 21 shows a semiconductor device in accordance with Example 3. The semiconductor device of Example 3 is a flash-memory cell transistor, and includes: a source region 42a and a drain region 42b that are formed at a distance from each other on a Si substrate 41; a tunnel insulating film 44 that is formed on the portion of the Si substrate to be a channel region 43 between the source region 42a and the drain region 42b; a floating gate electrode 45 that is formed on the tunnel insulating film 44; an interelectrode insulating film 46 that is formed on the floating electrode 45; and a control gate electrode 47 that is formed on the interelectrode insulating film 46. The tunnel insulating film 44 is formed with amorphous SiON, for example. The electrodes 45 and 47 are formed with polysilicon doped with phosphorus (P). The interelectrode insulating film 46 is formed with one of the oxides according to the above embodiment, as will be described later in detail.

Next, the procedures for manufacturing the memory cells of Example 3 are described. First, through the same procedure as that of Example 1, the clean surface of the substrate 41 having a (001)-plane as its principal surface is caused to appear.

The tunnel insulating film 44 formed with SiON, the floating electrode 45 formed with P-doped polysilicon, and the interelectrode insulating film 46 formed with H-added HfAlO are then formed in this order. The HfAlO film is formed by performing sputtering at a high temperature of 800° C. The film thickness of the HfAlO film is 15 nm. The oxygen partial pressure is set at zero since the initial stage of the sputtering film formation, and the film formation is performed in a reduced atmosphere of an atmosphere having plasma hydrogen (or excited hydrogen) introduced thereto. In the sputtering film formation, two targets, an Al$_2$O$_3$ target and a HfO$_2$ target, are used. After the film formation, the amount of Al in the HfAlO film is 1.8 atomic % (1.7×10$^{21}$ cm$^{-3}$ in density). In this example, the film formation is performed by a sputtering technique, but the same result can be achieved by MBE, CVD, ALD, or the like. After that, 30-second RTA is performed at 900° C. A P-doped polysilicon film to be the control gate electrode 47 is then formed on the interelectrode insulating film 46.

SIMS analysis is conducted on the distributions of the hydrogen concentration and the Al concentration in the interelectrode insulating film 44 formed with a HfO$_2$ film having H and Al added thereto. In the interelectrode insulating film 44, the hydrogen concentration distribution and the Al concentration distribution overlap with each other, and may be regarded as the same as each other, in view of the precision of the SIMS analysis. This indicates that hydrogen can be located in the vicinity of Al at the ratio of 1:1, depending on the film formation method in this example.

After that, ion implantation or the like is performed to form the source region 42a and the source region 42b on the surface of the substrate 41, with the channel region 43 being interposed between the source region 42a and the drain region 42b. In this manner, a flash-memory cell transistor is formed.

Memory cells are produced in the above manner, and the characteristics of a memory cell having hydrogen added to the interelectrode insulating film 46 and the characteristics of a memory cell having no hydrogen added to the interelectrode insulating film 46 are examined. First, in each of the memory cells, the interelectrode insulating film 46 is a thin insulating film of 2.5 nm in film thickness (EOT) converted into the film thickness of a $SiO_2$ film.

The leakage current generated when a large electric field of 5 MV/cm is induced is then measured. The leakage current in the memory cell having no hydrogen added thereto is approximately 0.1 $A/cm^2$, but the leakage current in the memory cell having hydrogen added thereto is much lower, being 0.0001 $A/cm^2$. The interelectrode insulating film of the memory cell having no hydrogen added thereto is a $HfO_2$ film having Al added thereto, and there are a large amount of oxygen defects existing in the $HfO_2$ film. Since electrons can easily enter and leave oxygen defects, the oxygen defects are considered to be the cause of an increase in leakage current. In the interelectrode insulating film of the memory cell of this example, however, the cause of the leakage current increase is eliminated, as hydrogen enters the oxygen defects.

As for the time-dependent changes observed while voltages are being applied, the memory cell having no hydrogen introduced thereto breaks down within a few hours, but the memory cell having hydrogen introduced thereto does not break down even after several days.

In the interelectrode insulating film having no hydrogen introduced thereto, charges are accumulated with time, and the results of an examination conducted on the capacitance-voltage (C-V) characteristics indicate that the hysteresis is larger in the increasing and decreasing direction of the applied voltage. In the interelectrode insulating film having hydrogen introduced thereto, on the other hand, the hysteresis is restricted to 10 mV or less.

In the memory cell having hydrogen introduced into the interelectrode insulating film as in this example, only several percents of accumulated charges disappear even after several days have passed. In the memory cell having no hydrogen introduced into the interelectrode insulating film, on the other hand, the accumulated charges are rapidly released to the outside, and disappear within several hours. This is because there are many oxygen defects, and a leakage current easily flows through the oxygen defects. In conventional cases, it is necessary to prevent the leakage current by forming a multilayer film such as an $Al_2O_3/HfAlO/Al_2O_3$ film, though the film thickness becomes larger. However, in view of the charge accumulation, it has become apparent that a multilayer film structure does not need to be formed if an appropriate amount of hydrogen is introduced as in this example.

The effects of the improvement of the insulating film characteristics described so far are that oxygen defects disappear by virtue of hydrogen, the bandgap is not narrowed, and there is not a level appearing in the gap. In accordance with this example, the characteristics and reliability of the interelectrode insulating film are greatly improved.

In this example, $HfO_2$ having Al and H added thereto is taken as an example. However, an excellent interelectrode insulating film that has no oxygen defects, no narrowing of the bandgap, and no levels in the gap can be obtained by using $HfO_2$ having N and H added thereto, $ZrO_2$ having H and a divalent material such as Ca added thereto, $LaAlO_3$ having H and a divalent material such as Ba added thereto, or the like.

As described above, in accordance with this example, oxygen defects can be restricted as much as possible, and the leakage current can be reduced. Accordingly, an interelectrode insulating film with high reliability and a memory cell transistor including the interelectrode insulating film can be obtained.

In this example, the interelectrode insulating film is formed with the insulating film in accordance with the embodiment. However, since the insulating film in accordance with the embodiment can also be used as a tunnel insulating film, the interelectrode insulating film and the tunnel insulating film of this example may be both formed with the insulating film in accordance with the embodiment.

Example 4

Figure 22:
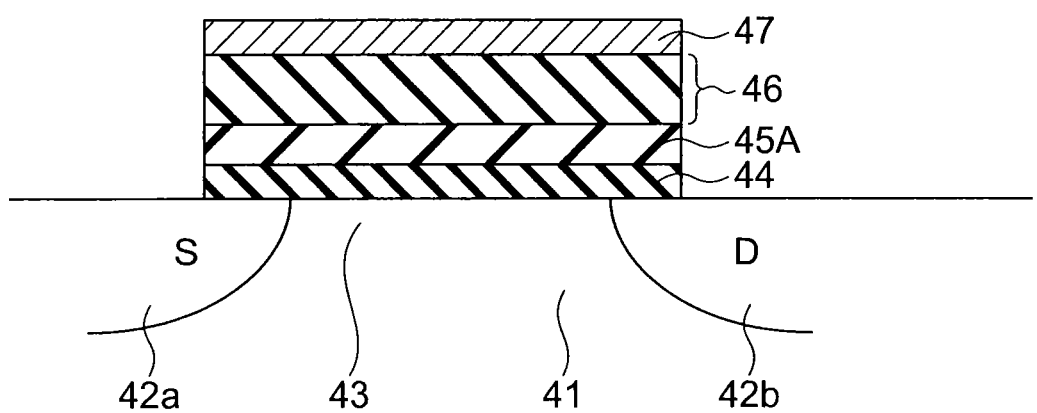
FIG. 22 is a cross-sectional view of a memory cell transistor of Example 4.

FIG. 22 shows a semiconductor device in accordance with Example 4. The semiconductor device of this example is the same as the memory cell transistor of Example 3 shown in FIG. 21, except that the floating gate electrode 45 is replaced with a charge trapping film 45A formed with a silicon nitride film, for example. The semiconductor device of this example is a charge-trapping memory cell transistor. Although the interelectrode insulating film 46 of Example 3 is referred to as a block insulating film 46 in Example 4, the block insulating film 46 is formed with the same $HfO_2$ film having Al and H added thereto as the interelectrode insulating film 46 of Example 3.

In Example 4, a $HfO_2$ film having Al and H added thereto is used as the block insulating film 46. However, an excellent block insulating film that has no oxygen defects, no narrowing of the bandgap, and no levels in the gap can be obtained by using $HfO_2$ having N and H added thereto, $ZrO_2$ having H and a divalent material such as Ca or Mg added thereto, $LaAlO_3$ having H and a divalent material such as Ba added thereto, or the like.

As described above, in accordance with this example, oxygen defects can be restricted as much as possible, and the leakage current can be reduced. Accordingly, a block insulating film with high reliability and a memory cell transistor including the block insulating film can be obtained.

In this example, the block insulating film is formed with the insulating film in accordance with the embodiment. However, since the insulating film in accordance with the embodiment can also be used as a tunnel insulating film or a charge trapping film, at least one of the tunnel insulating film, the charge trapping film, and the block insulating film of this example may be formed with the insulating film in accordance with the embodiment.

The insulating film in accordance with the embodiment has a metal oxide as its parent material. As hydrogen is introduced into the insulating film, the amount of oxygen defects that can move in the insulating film is greatly reduced. However, when hydrogen is introduced, only an appropriate amount of nitrogen or a metal material with lower valence than the parent metal of the insulating film also needs to be introduced.

This embodiment is characterized in that, by adding N, a low-valence material such as Al, La, Y, Sc, Ba, Sr, Ca, or Mg, or a lanthanum series material, the number of oxygen defects in the oxide is increased, and the oxygen defects are tightly fixed with hydrogen to lose the mobility. Oxygen defects induce various kinds of deteriorations in many oxides having high dielectric constants. However, by introducing an appropriate amount of hydrogen, the film degradation to be caused by oxygen defects can be prevented. However, if only hydrogen is introduced, a charge center or the like is induced. Therefore, an appropriate amount of another material as well as hydrogen is introduced. In this manner, it becomes possible to eliminate the problems that are caused if only one of the materials is introduced.

As a result, the following effects are achieved: (1) an amorphous structure can be maintained at a high temperature; (2) since there is no narrowing of the bandgap and there is not a level appearing in the gap, leakage current is greatly improved; (3) much higher reliability is obtained, as oxygen defects disappear, and hydrogen is fixed at lattices points; (4) internal fixed charges or fixed polarization are not caused, as the entire system is stabilized through charge compensation; (5) there is no breakdown due to injected charges, since there is not a level at which charges are injected; (6) an added material that normally forms ion conductors can be used as a high-performance insulating film, since an appropriate amount of hydrogen is introduced; and (7) an added material that might cause phase separation can be used as a high-performance insulating film, since an appropriate amount of hydrogen is introduced.

As can be seen from the above described embodiment and examples, an insulating film in accordance with an embodiment contains a first metal element, oxygen, hydrogen, and one element of a second metal element and nitrogen. This insulating film satisfies the following relationship:

$$\{k \times [X] - [H]\}/2 \leq 1.0 \times 10^{21} \text{ cm}^{-3}$$

where [X] represents the amount of the one element, [H] represents the hydrogen amount, and k represents the difference in valence between the first metal element and the second metal element or the difference in valence between oxygen and nitrogen.

In a case where the one element is nitrogen, the relationship, [X]=[N], is satisfied, where [N] represents the nitrogen amount, and k represents the difference in valence between oxygen and nitrogen, which is 1.

In a case where the one element is the second metal element, the first metal element is a quadrivalent metal, and the second metal element is a trivalent metal, the relationship, [X]=[III metal], is satisfied, where [III metal] represents the amount of the trivalent metal, and k is 1.

In a case where the one element is the second metal element, the first metal element is a quadrivalent metal, and the second metal element is a divalent metal, the relationship, [X]=[II metal], is satisfied, where [II metal] represents the amount of the divalent metal, and k is 2.

In a case where the one element is the second metal element, the first metal element is a trivalent metal, and the second metal element is a divalent metal, the relationship, [X]=[II metal], is satisfied, and k is 1.

The amount [X] of the one element and the hydrogen amount [H] might satisfy the following relationship:

$$\{k \times [X] - [H]\}/2 \leq 3.0 \times 10^{20} \text{ cm}^{-3}$$

The amount [X] of the one element might satisfy the following relationship:

$$6.4 \times 10^{19} \text{ cm}^{-3} \leq [X] \leq 1.6 \times 10^{22} \text{ cm}^{-3}/k$$

The amount [X] of the one element might satisfy the following relationship:

$$3.0 \times 10^{20} \text{ cm}^{-3} \leq [X] \leq 2.0 \times 10^{21} \text{ cm}^{-3}/k$$

The insulating film may be an amorphous film.
The insulating film may be a silicate.
In the insulating film, the one element may be nitrogen, k is 1, and the relationship, k×[X]=1×[N], is satisfied, where the nitrogen amount is equal to or larger than the hydrogen amount, and the hydrogen atoms are coupled to the nitrogen atoms through one atom of the first metal element.

In the insulating film, the one element may be the second metal element, the first metal element may be a quadrivalent metal element, and the second metal element may be a trivalent metal element, k is 1, and the relationship, k×[X]=1×[III metal], is satisfied, where the amount of the trivalent metal element is equal to or larger than the hydrogen amount, and the trivalent metal element is located adjacent to the hydrogen.

In the insulating film, the one element may be the second metal element, the first metal element may be a quadrivalent metal element, and the second metal element may be a trivalent metal element, k is 1, and the relationship, k×[X]=1×[III metal], is satisfied, where the quadrivalent metal element contains one metal element selected from the group of Hf, Zr, and Ti, and the trivalent metal element contains one metal element selected from the group of Al, Sc, Y, La, Ce, Pr, Nd, Pm, Sm, Eu, Gd, Tb, Dy, Ho, Er, Tm, Yb, and Lu.

In the insulating film, the one element may be the second metal element, the first metal element may contain a quadrivalent metal element, and the second metal element may contain a divalent metal element, k is 2, and the relationship, k×[X]=2×[II metal], is satisfied, where 2×[II metal], which is twice the amount of the divalent metal element, is equal to or larger than the hydrogen amount, and the hydrogen is coupled to the divalent metal element.

In the insulating film, the one element may be the second metal element, the first metal element may contain a quadrivalent metal element, and the second metal element may contain a divalent metal element, k is 2, and the relationship, k×[X]=2×[II metal], is satisfied, where the quadrivalent metal element contains one metal element selected from the group of Hf, Zr, and Ti, and the divalent metal element contains one metal element selected from the group of Mg, Ca, Sr, and Ba.

In the insulating film, the one element may be the second metal element, the first metal element may contain a trivalent metal element, and the second metal element may contain a divalent metal element, k is 1, and the relationship, k×[X]=1×[II metal], is satisfied, where the amount of the divalent metal element is equal to or larger than the hydrogen amount, and the divalent metal element is located adjacent to the hydrogen.

In the insulating film, the one element may be the second metal element, the first metal element may contain a trivalent metal element, and the second metal element may contain a divalent metal element, k is 1, and the relationship, k×[X]=1×[II metal], is satisfied, where the trivalent metal element contains one element selected from the group of Al, Sc, Y, La, Ce, Pr, Nd, Pm, Sm, Eu, Gd, Tb, Dy, Ho, Er, Tm, Yb, and Lu, and the divalent metal element contains one element selected from the group of Mg, Ca, Sr, and Ba.

It is obvious to those skilled in the art that various changes and modifications may be made to the above embodiments and examples without departing from the spirit of the invention, and those changes and modifications should be considered to be within the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method for manufacturing a semiconductor device, comprising:
   forming a high-dielectric metal oxide film having a lower face and an upper face opposed to the lower face, a distance between the lower face and the upper face being a film thickness of the high-dielectric metal oxide film;
   introducing nitrogen into the high-dielectric metal oxide film; and
   introducing hydrogen excited in an atomic state into the high-dielectric metal oxide film,
   wherein a nitrogen amount [N] and a hydrogen amount [H] in the high-dielectric metal oxide film satisfy the following first relationship (1) and the following second relationship (2) through the dielectric metal oxide film in a film thickness direction from the lower face to the upper face;

$$0 \leq \{[N]-[H]\}/2 \leq 3.0 \times 10^{20} \, cm^{-3} \quad (1),$$

$$0 \, at\% \leq [N]-[H] \leq 1.0 \, at\% \quad (2).$$

2. The method according to claim 1, further comprising:
   annealing the high-dielectric metal oxide film having the nitrogen and the hydrogen introduced into the high-dielectric metal oxide film.

3. The method according to claim 2, wherein the annealing of the high-dielectric metal oxide film is performed at a temperature of 950° C. or lower.

4. The method according to claim 1, wherein the introducing of nitrogen and the introducing of hydrogen are performed during forming of the high-dielectric metal oxide film.

5. The method according to claim 1, wherein the introducing of hydrogen is performed with using plasma hydrogenation or excited hydrogenation.

6. The method according to claim 1, wherein the introducing of nitrogen is performed with using plasma nitridation.

7. The method according to claim 1, wherein a nitrogen amount and a hydrogen amount in the high-dielectric metal oxide film are substantially equal to each other.

8. The method according to claim 7, wherein a distribution of nitrogen in the high-dielectric metal oxide film and a distribution of hydrogen in the high-dielectric metal oxide film are substantially identical to each other.

9. The method according to claim 1, wherein:
   a nitrogen amount [N] in the high-dielectric metal oxide film satisfies the following relationship:

$$3.0 \times 10^{20} \, cm^{-3} \leq [N] \leq 2.0 \times 10^{21} \, cm^{-3}; \, and$$

a hydrogen amount [H] in the high-dielectric metal oxide film satisfies the following relationship:

$$3.0 \times 10^{20} \, cm^{-3} \leq [H] \leq 2.0 \times 10^{21} \, cm^{-3}.$$

10. The method according to claim 1, wherein the high-dielectric metal oxide film is a gate insulating film of a MISFET.

11. The method according to claim 1, wherein the high-dielectric metal oxide film is an interelectrode insulating film of a flash-memory cell transistor.

12. The method according to claim 1, wherein the high-dielectric metal oxide film is a capacitor insulating film of a MIM capacitor.

13. The method according to claim 1, wherein the nitrogen amount [N] and the hydrogen amount [H] in the high-dielectric metal oxide film satisfy following relationship through the high-dielectric metal oxide film in the film thickness direction from the lower face to the upper face;

$$0 \, at\% \leq [N]-[H] \leq 0.1 \, at\%.$$

14. The method according to claim 1, wherein the nitrogen and the hydrogen are simultaneously introduced into the high-dielectric metal oxide film.

15. The method according to claim 1, wherein the high-dielectric metal oxide film comprises one of a quadrivalent metal and a trivalent metal.

* * * * *